(12) United States Patent
Shih et al.

(10) Patent No.: US 12,554,059 B2
(45) Date of Patent: Feb. 17, 2026

(54) WAVEGUIDE PHOTODETECTOR AND METHOD FOR FORMING THE SAME

(71) Applicant: Taiwan Semiconductor Manufacturing Company, Ltd., Hsinchu (TW)

(72) Inventors: Chih-Tsung Shih, Hsinchu (TW); Chi-Yuan Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 236 days.

(21) Appl. No.: 18/490,228

(22) Filed: Oct. 19, 2023

(65) Prior Publication Data

US 2025/0130367 A1    Apr. 24, 2025

(51) Int. Cl.
*G02B 6/122* (2006.01)
*G02B 6/136* (2006.01)
(Continued)

(52) U.S. Cl.
CPC ............ *G02B 6/122* (2013.01); *G02B 6/136* (2013.01); *H10F 30/2255* (2025.01);
(Continued)

(58) Field of Classification Search
CPC ........ G02B 6/122; G02B 6/136; H10F 30/223
See application file for complete search history.

(56) References Cited

U.S. PATENT DOCUMENTS 7,397,101 B1 *   7/2008   Masini ................. H10F 30/223
                                                         257/656
8,290,325 B2 *  10/2012   Reshotko ............. H10F 30/223
                                                         385/129

(Continued)

FOREIGN PATENT DOCUMENTS

| CN | 106463566 A | * | 2/2017 | ........... H10F 77/122 |
| FR | 3009893 A1 | * | 2/2015 | ........... H10F 77/413 |
| WO | 2023108857 A1 | | 6/2023 | |

OTHER PUBLICATIONS

Wang et al. "High-speed Si—Ge avalanche photodiodes" Photonix, (2022) 3:8, published on Mar. 25, 2022.
(Continued)

*Primary Examiner* — Charlie Y Peng

(74) *Attorney, Agent, or Firm* — Eschweiler & Potashnik, LLC

(57) ABSTRACT

A waveguide photodetector includes a slab over a substrate, first and second contact portions protruding upward from the slab, and a ridge protruding upward from the slab between the first and second contact portions. A first semiconductor layer is over the substrate and includes a first doped region (Continued)

in the first contact portion, a second doped region in the slab between the first contact portion and the ridge, a third doped region and a sixth doped region in the ridge, a fourth doped region in the second contact portion, a fifth doped region in the slab between the second contact portion and the ridge, a first intrinsic region between the sixth and third doped regions, and a second intrinsic region between the sixth and fifth doped regions. A second semiconductor layer is over the first intrinsic region and between the sixth and third doped regions.

20 Claims, 15 Drawing Sheets

(51) Int. Cl.
  *H10F 30/225* (2025.01)
  *H10F 71/00* (2025.01)
  *H10F 77/40* (2025.01)
  *G02B 6/12* (2006.01)

(52) U.S. Cl.
  CPC ......... *H10F 71/121* (2025.01); *H10F 77/413* (2025.01); *G02B 2006/12097* (2013.01); *G02B 2006/12138* (2013.01)

(56) References Cited

U.S. PATENT DOCUMENTS

| | | |
|---|---|---|
| 2010/0025787 A1 | 2/2010 | Geis et al. |
| 2010/0213561 A1 | 8/2010 | Assefa et al. |
| 2011/0013864 A1 | 1/2011 | Knights et al. |
| 2015/0056740 A1 | 2/2015 | Menezo |
| 2019/0326468 A1 | 10/2019 | Alloatti et al. |
| 2023/0178666 A1 | 6/2023 | Takemura |
| 2025/0048750 A1* | 2/2025 | Hu ........................ H10F 30/225 |

OTHER PUBLICATIONS

Kang et al. "Monolithic germanium/silicon avalanche photodiodes with 340 GHz gain-bandwidth product" Nature Photonics, 2008. 247, published on Dec. 7, 2008.

Xiang et al. "High-performance waveguide Ge/Si avalanche photodiode with a lateral separate-absorption-charge-multiplication structure" Optics Express, vol. 30, No. 7, published on Mar. 28, 2022.

Li et al. "Lateral separate absorption charge multiplication Ge-on-Si avalanche photodiode with low dark current in linear mode" Optics Communications, 518 (2022) 128343, published on Apr. 21, 2022.

Xiang et al. "High-speed waveguide Ge/Si avalanche photodiode with a gain-bandwidth product of 615 GHz" Optica, vol. 9, No. 7, published on Jul. 5, 2022.

\* cited by examiner

WAVEGUIDE PHOTODETECTOR AND METHOD FOR FORMING THE SAME

BACKGROUND

Optical waveguides are often used as components in integrated optical circuits. Optical waveguides are used to confine and guide light from a first point on an integrated chip (IC) to a second point on the IC with minimal attenuation. Many modern optical waveguides are formed using semiconductors. A semiconductor waveguide may include an optical converter or an optical coupler for optically coupling an optical fiber to the semiconductor waveguide. Many integrated optical circuits include photodetectors such as, for example, avalanche photodiodes (APD).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
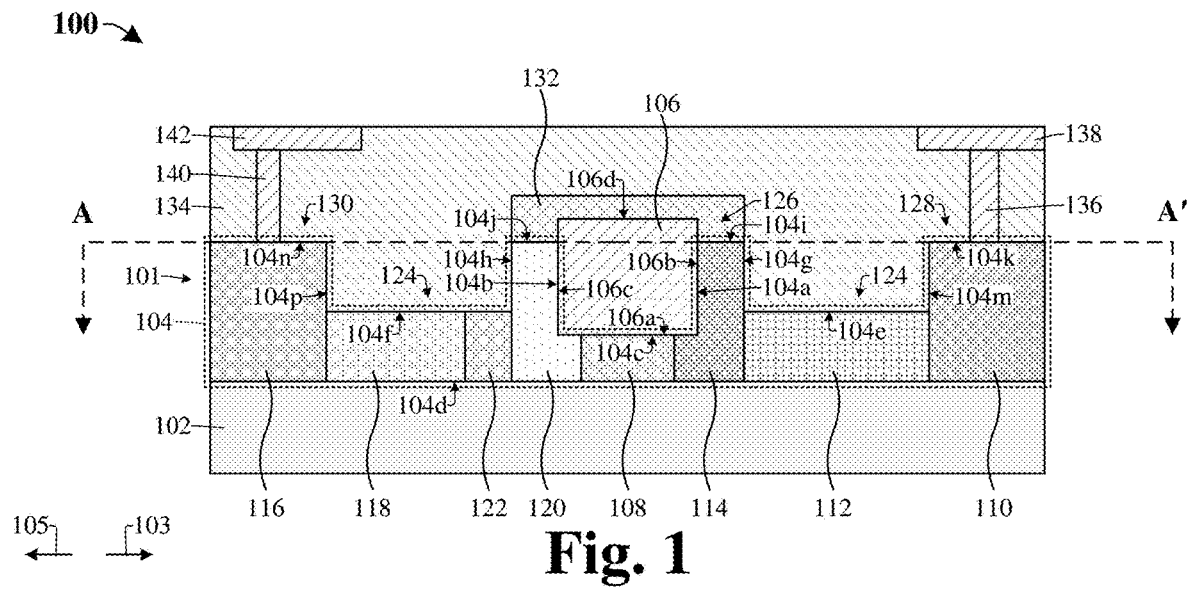
FIG. 1 illustrates a cross-sectional view of some embodiments of an integrated chip including a waveguide photodetector.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip includes a semiconductor waveguide and a waveguide photodetector (e.g., an avalanche photodiode (APD) or the like) arranged along the waveguide. The waveguide photodetector is configured to convert an optical signal (e.g., optical radiation) traveling through the waveguide into an electrical signal (e.g., current). The waveguide photodetector is formed by a first semiconductor layer and a second semiconductor layer overlying the first semiconductor layer. The second semiconductor layer forms an absorption region of the waveguide photodetector. The absorption region is configured to absorb photons traveling through the waveguide. The first semiconductor layer includes an intrinsic region directly under the second semiconductor layer, a first doped region having a first doping type (e.g., p-type doping) on a first side of the intrinsic region, and a second doped region having a second doping type (e.g., n-type doping), different than the first doping type, on a second side of the intrinsic region.

A challenge with the waveguide photodetector is that the responsivity (e.g., a ratio of the photocurrent generated per the incident optical power) of the waveguide photodetector may be low. Thus, a signal traveling through the waveguide may need an increased optical power for the waveguide photodetector to generate substantial photocurrent (e.g., greater than 100 microamps, greater than 200 microamps, or some other suitable value).

In various embodiment of the present disclosure, the waveguide photodetector further includes a charge region and an intrinsic multiplication region to improve the responsivity of the waveguide photodetector. For example, the charge region has the first doping type (e.g., p-type), is on the second side of the intrinsic region, and is between the intrinsic region and the second doped region. Further, the intrinsic multiplication region is between the charge region and the second doped region.

By including the charge region and the intrinsic multiplication region in the waveguide photodetector, carrier multiplication in the photodetector can be increased. By increasing carrier multiplication, the amount of photocurrent generated by the waveguide photodetector in response to an incident optical signal can be increased without increasing the optical power of the incident optical signal. Thus, the optical power of the optical signals being transmitted via the optical waveguide and detected by the waveguide photodetector can be reduced.

Figure 2:
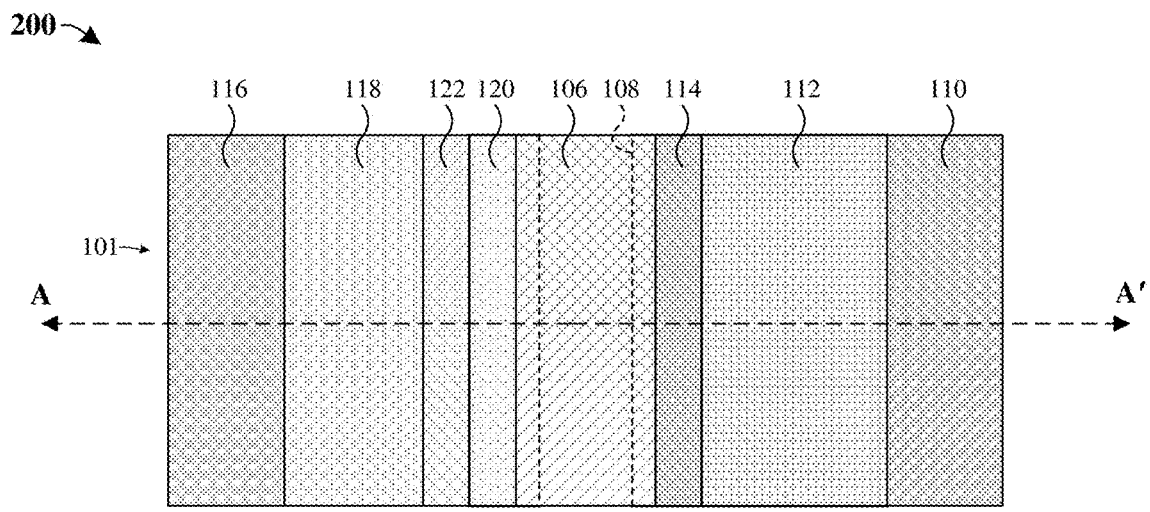
FIG. 2 illustrates a top view of some embodiments of the waveguide photodetector of FIG. 1.

FIG. 1 illustrates a cross-sectional view 100 of some embodiments of an integrated chip including a waveguide photodetector 101. FIG. 2 illustrates a top view 200 of some embodiments of the waveguide photodetector 101 of FIG. 1. In some embodiments, cross-sectional view 100 of FIG. 1 may, for example, be taken across line A-A' of FIG. 2.

A first semiconductor layer 104 is over a substrate 102. A second semiconductor layer 106 is between a first sidewall 104a and a second sidewall 104b of the first semiconductor layer 104 and on a first upper surface 104c of the first semiconductor layer 104. The first semiconductor layer 104 comprises a first semiconductor (e.g., silicon or some other suitable semiconductor) and the second semiconductor layer 106 comprises a second semiconductor (e.g., germanium or some other suitable semiconductor) different than the first semiconductor. The first semiconductor layer 104 includes a first intrinsic region 108, a first doped region 110, a second doped region 112, a third doped region 114, a fourth doped region 116, a fifth doped region 118, a sixth doped region 120, and a second intrinsic region 122. The first intrinsic region 108, the first doped region 110, the second doped region 112, the third doped region 114, the fourth doped region 116, the fifth doped region 118, the sixth doped region 120, the second intrinsic region 122, and the second semiconductor layer 106 form the waveguide photodetector 101.

The first intrinsic region 108 is directly under the second semiconductor layer 106. The first doped region 110 is laterally spaced from the first intrinsic region 108 and the second semiconductor layer 106 in a first direction 103. In some embodiments, the first doped region 110 forms an anode of the waveguide photodetector 101. The first doped region 110 has a first doping type (e.g., p-type) and a first doping concentration. The second doped region 112 is laterally between the first doped region 110 and the first intrinsic region 108. The second doped region 112 has the first doping type and a second doping concentration less than the first doping concentration. The third doped region 114 is laterally between the second doped region 112 and the first intrinsic region 108. The third doped region 114 is directly under the second semiconductor layer 106 and beside the second semiconductor layer 106. For example, the third doped region 114 extends along a bottom surface 106a of the second semiconductor layer 106 and a first sidewall 106b of the second semiconductor layer 106. The third doped region 114 has the first doping type and a third doping concentration less than the second doping concentration.

The fourth doped region 116 is laterally spaced from the first intrinsic region 108 and the second semiconductor layer 106 in a second direction 105 opposite the first direction 103. In some embodiments, the fourth doped region 116 forms a cathode of the waveguide photodetector 101. The fourth doped region 116 has a second doping type (e.g., n-type), different than the first doping type, and a fourth doping concentration. The fifth doped region 118 is laterally between the fourth doped region 116 and the first intrinsic region 108. The fifth doped region 118 has the second doping type and a fifth doping concentration less than the fourth doping concentration. A sixth doped region 120 (e.g., a charge region of the waveguide photodetector 101) is laterally between the fifth doped region 118 and the first intrinsic region 108. The sixth doped region 120 is directly under the second semiconductor layer 106 and beside the second semiconductor layer 106. For example, the third doped region 114 extends along the bottom surface 106a of the second semiconductor layer 106 and a second sidewall 106c of the second semiconductor layer 106. The sixth doped region 120 has the first doping type and a sixth doping concentration less than the second doping concentration. A second intrinsic region 122 (e.g., a multiplication region of the waveguide photodetector 101) is laterally between the sixth doped region 120 and the fifth doped region 118.

The waveguide photodetector 101 includes a slab portion 124, a ridge portion 126, and a first contact portion 128, and a second contact portion 130. The slab portion 124 of the waveguide photodetector 101 is delimited by a bottom surface 104d, a second upper surface 104e, and a third upper surface 104f of the first semiconductor layer 104. The ridge portion 126 of the waveguide photodetector 101 is delimited by a third sidewall 104g of the first semiconductor layer 104, a fourth sidewall 104h of the first semiconductor layer 104, a first top surface 104i of the first semiconductor layer 104, a second top surface 104j of the first semiconductor layer 104, an upper portion of the first sidewall 106b of the second semiconductor layer 106, an upper portion of the second sidewall 106c of the second semiconductor layer 106, and a top surface 106d of the second semiconductor layer 106. The first contact portion 128 is delimited by a third top surface 104k and a fifth sidewall 104m of the first semiconductor layer 104. The second contact portion 130 is delimited by a fourth top surface 104n and a sixth sidewall 104p of the first semiconductor layer 104.

The second semiconductor layer 106 forms an absorption region of the waveguide photodetector 101. Photons traveling along the ridge portion 126 may be absorbed in the second semiconductor layer 106. When photons are absorbed in the waveguide photodetector 101, electron-hole pairs are formed. An electric field in the waveguide photodetector 101 causes these charge carriers to be accelerated towards their corresponding electrodes (e.g., anode and cathode), thereby generating a photocurrent. By including the sixth doped region 120 (e.g., the charge region) and the second intrinsic region 122 (e.g., the multiplication region), the electric field in the waveguide photodetector 101 can be increased. More particularly, a high electric field is generated at the second intrinsic region 122. This high electric field further accelerates the charge carriers. These highly accelerated charge carriers can have high enough energy to excite additional charge carriers, thereby increasing the photocurrent. Thus, by increasing the electric field in the waveguide photodetector 101 with the sixth doped region 120 (e.g., the charge region) and the second intrinsic region 122 (e.g., the multiplication region), the amount of photocurrent generated by the waveguide photodetector 101 can be increased and hence the responsivity of the waveguide photodetector 101 can be increased.

In some embodiments, the second intrinsic region 122 is adjacent to the ridge portion 126. For example, the sixth doped region 120 and the second intrinsic region 122 meet at an interface that is directly under sidewall 104h of the first semiconductor layer 104.

The first upper surface 104c of the first semiconductor layer 104 and the bottom surface 106a of the second semiconductor layer 106 are disposed at a first height over the substrate 102. The second upper surface 104e and the third upper surface 104f of the first semiconductor layer 104 are disposed at a second height over the substrate 102 greater than the first height. The first top surface 104i, the second top surface 104j, the third top surface 104k, and the fourth top surface 104n are disposed at a third height over the substrate 102 greater than the second height. The top surface 106d of the second semiconductor layer 106 is disposed at a fourth height over the substrate 102 greater than the third height.

A dielectric cap 132 is over the ridge portion 126 of the waveguide photodetector 101. The dielectric cap 132 covers the first top surface 104i of the first semiconductor layer 104, the second top surface 104j of the first semiconductor layer, and the top surface 106d of the second semiconductor layer 106. The dielectric cap 132 protects the second semiconductor layer 106. In some embodiments, the dielectric cap 132 comprises silicon nitride or some other suitable dielectric.

A dielectric layer 134 is over the waveguide photodetector 101 and the dielectric cap 132. The dielectric layer 134 comprises a different dielectric than the dielectric cap 132. For example, in some embodiments, the dielectric layer 134 comprises silicon dioxide or some other suitable dielectric. A first contact 136 extends through the dielectric layer 134 from a first metal line 138 to the first contact portion 128 of the waveguide photodetector 101 (and the first doped region 110 in the first contact portion 128). A second contact 140 extends through the dielectric layer from a second metal line 142 to the second contact portion 130 of the waveguide photodetector 101 (and the fourth doped region 116 in the second contact portion 130).

In some embodiments, the first doping type is p-type and the second doping type is n-type. In some other embodiments, the first doping type is n-type and the second doping type is p-type. In some embodiments, the dopant concentrations of the first doped region 110 and the fourth doped region 116 range from $10^{19}$ cm$^{-3}$ to $10^{22}$ cm$^{-3}$, $10^{20}$ cm$^{-3}$ to $10^{21}$ cm$^{-3}$, or some other suitable range. In some embodiments, the dopant concentrations of the second doped region 112 and the fifth doped region 118 range from $10^{18}$ cm$^{-3}$ to $10^{20}$ cm$^{-3}$, $10^{19}$ cm$^{-3}$ to $10^{20}$ cm$^{-3}$, or some other suitable range. In some embodiments, the dopant concentrations of the third doped region 114 and the sixth doped region 120 are approximately equal. In some embodiments, the dopant concentrations of the third doped region 114 and the sixth doped region 120 range from $10^{16}$ cm$^{-3}$ to $10^{19}$ cm$^{-3}$, $10^{16}$ cm$^{-3}$ to $10^{18}$ cm$^{-3}$, or some other suitable range.

In some embodiments, a height of the ridge portion 126 ranges from approximately 50 to 500 nanometers, 70-200 nanometers, or some other suitable range. In some embodiments, a width of the ridge portion 126 ranges from approximately 100 to 700 nanometers, 200 to 500 nanometers, or some other suitable range. In some embodiments, a width of the second intrinsic region 122 ranges from approximately 5 to 200 nanometers, 10 to 100 nanometers, or some other suitable range. In some embodiments, widths of the fifth doped region 118 and the second doped region 112 range from approximately 5 to 200 nanometers, 10 to 100 nanometers, or some other suitable range.

In some embodiments, the substrate 102 is or comprises a semiconductor (e.g., silicon or the like), a semiconductor-on insulator (SOI) substrate, a dielectric layer, a buried dielectric layer on a base semiconductor layer, or some other suitable substrate. The dielectric layer 134 is not shown in top view 200 of FIG. 2 for clarity of illustration of underlying layers.

Figure 3:
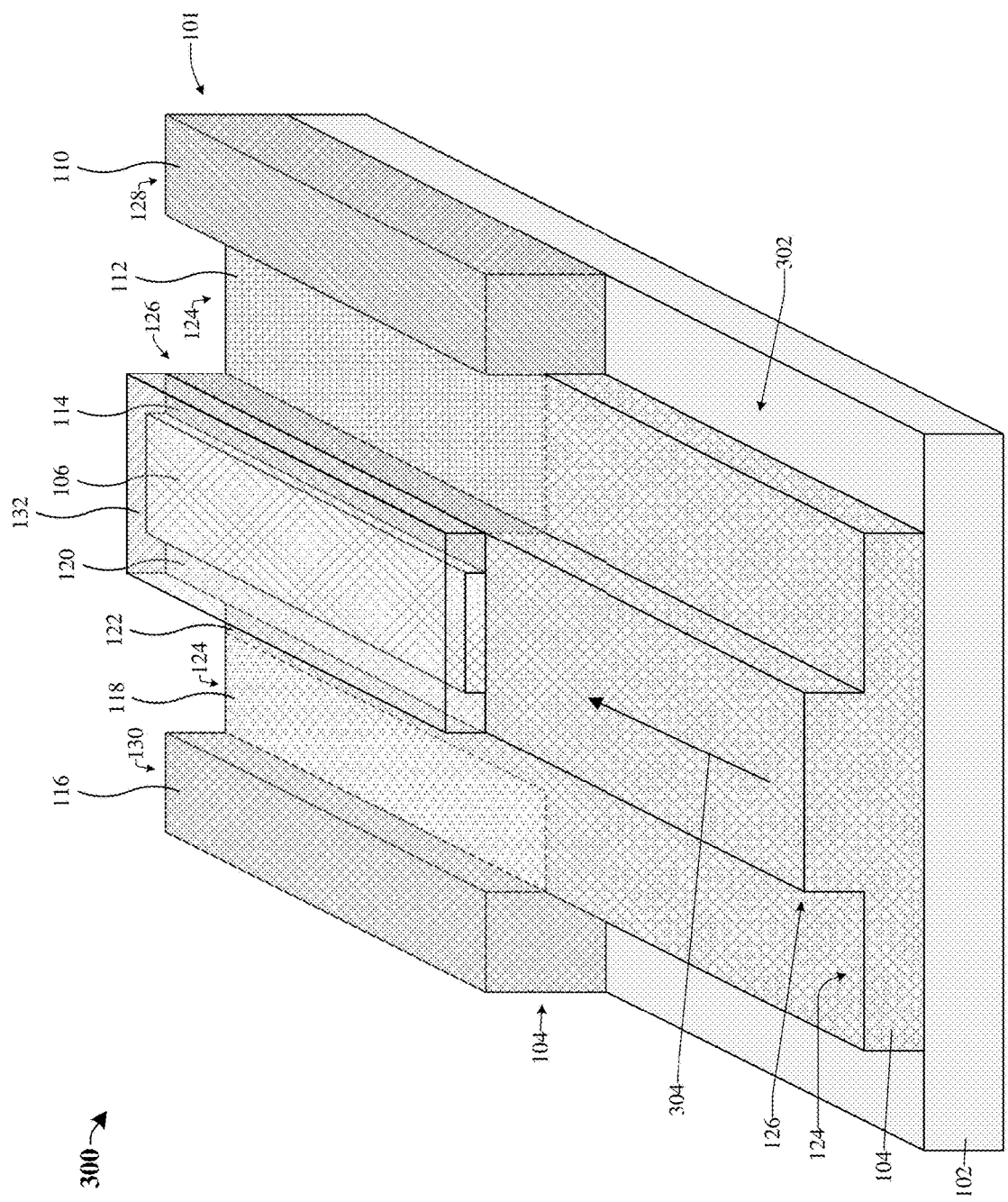
FIG. 3 illustrates a three-dimensional view of some embodiments of an integrated chip including a waveguide and the waveguide photodetector of FIG. 1.

FIG. 3 illustrates a three-dimensional view 300 of some embodiments of an integrated chip including a waveguide 302 and the waveguide photodetector 101 of FIG. 1.

Photons travel along the waveguide 302 (e.g., as illustrated by line 304) to the waveguide photodetector 101 where the photons are absorbed and converted into photocurrent. In some embodiments, the waveguide 302 is formed by the first semiconductor layer 104. The waveguide photodetector 101 is formed by the first semiconductor layer 104 and the second semiconductor layer 106. The first semiconductor layer 104 forms the ridge portion 126 and the slab portion 124 in the waveguide 302. The second semiconductor layer 106 further forms the ridge portion in the waveguide photodetector 101.

The dielectric cap 132 is shown as semi-transparent, and the dielectric layer 134, contacts 136, 140, and metal lines 138, 142 are not shown in three-dimensional view 300 of FIG. 3 for clarity of illustration of underlying layers.

Figure 4:
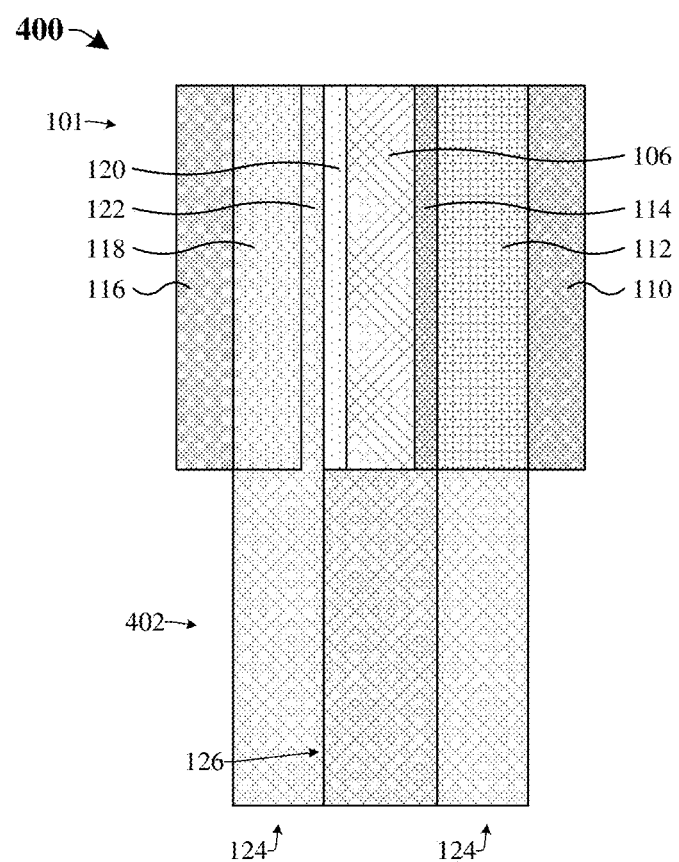
FIGS. 4-6 illustrate top views of some embodiments of an integrated chip in which the waveguide photodetector is arranged along various waveguides.
Figure 5:
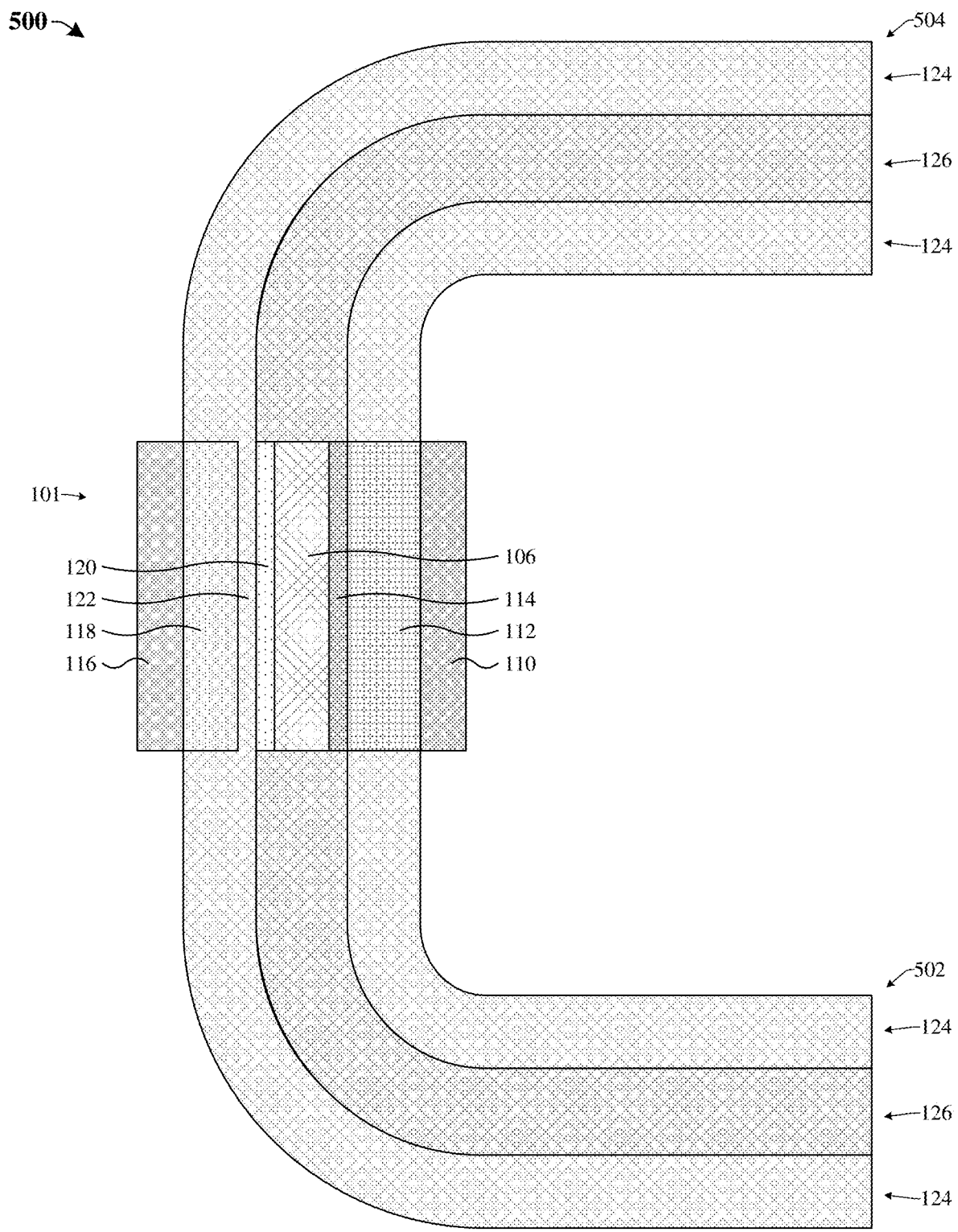
Figure 6:
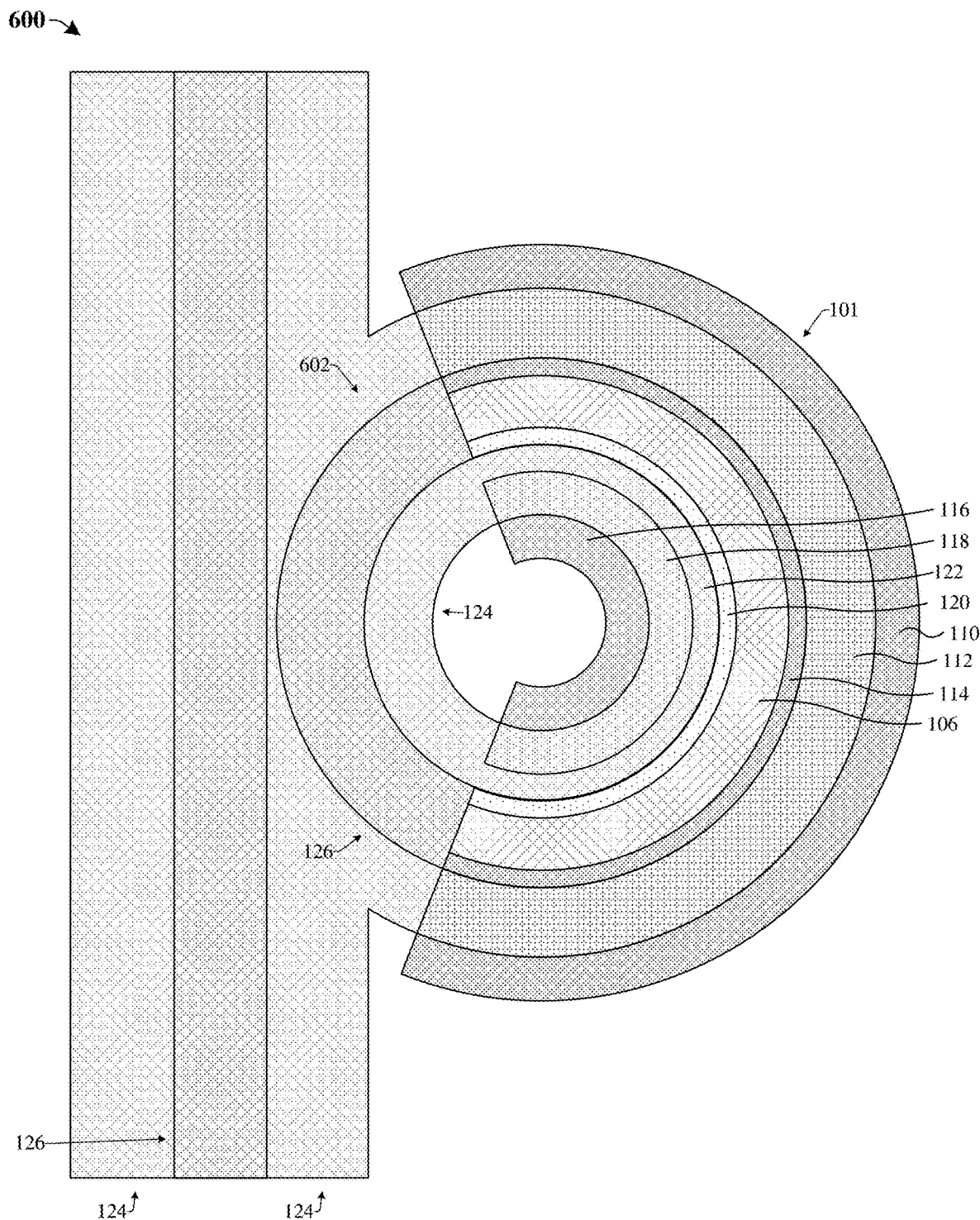
Figure 7:
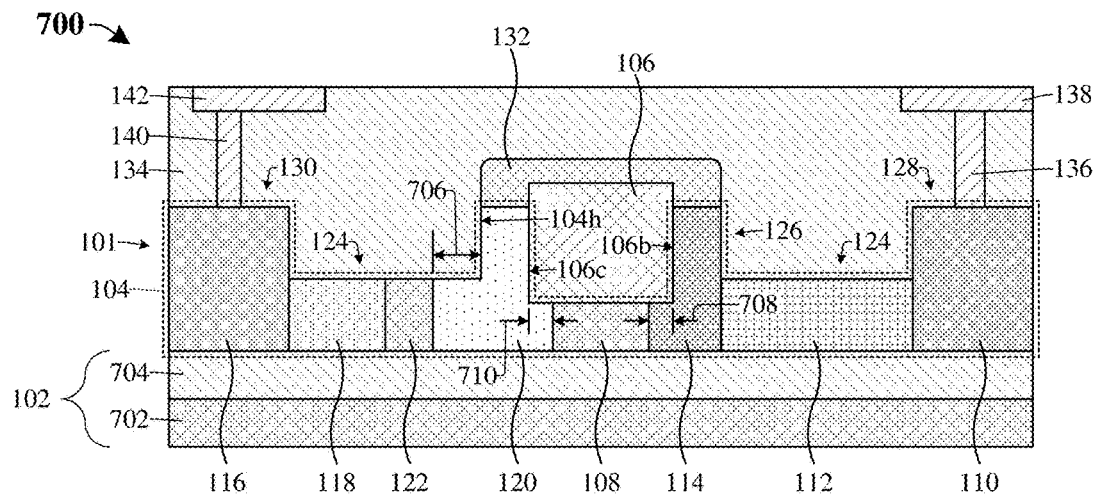
FIGS. 7-18 illustrate cross-sectional views of various embodiments of the waveguide photodetector of FIG. 1.
Figure 8:
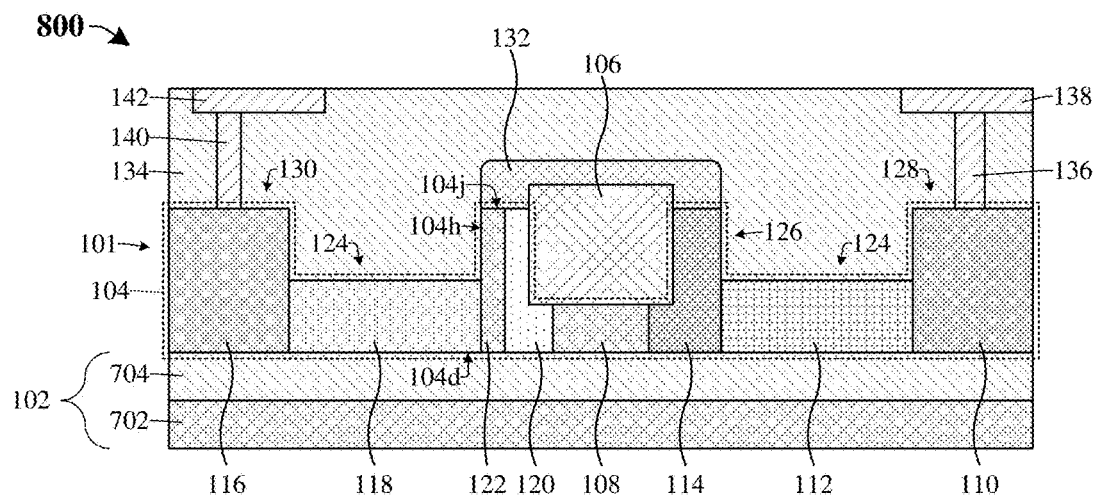
Figure 9:
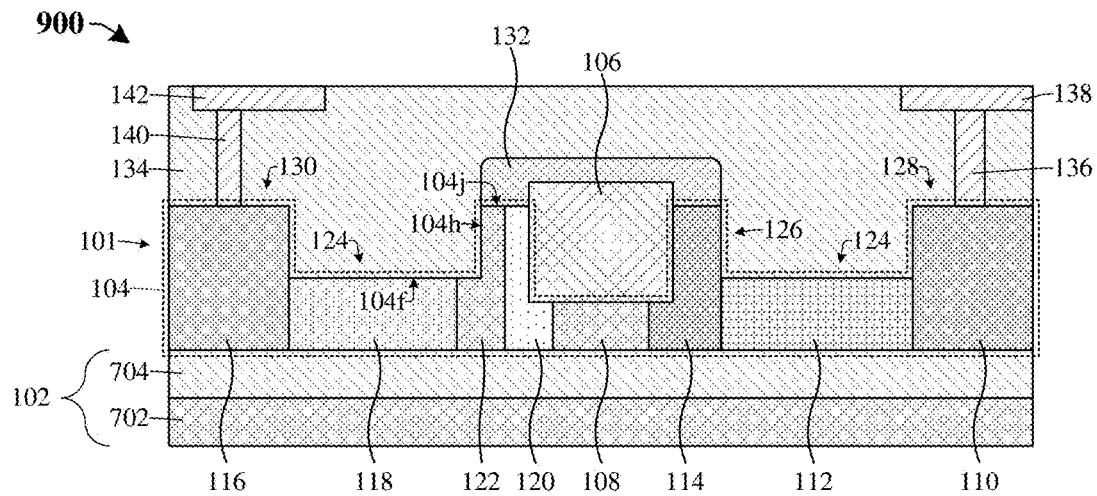
Figure 10:
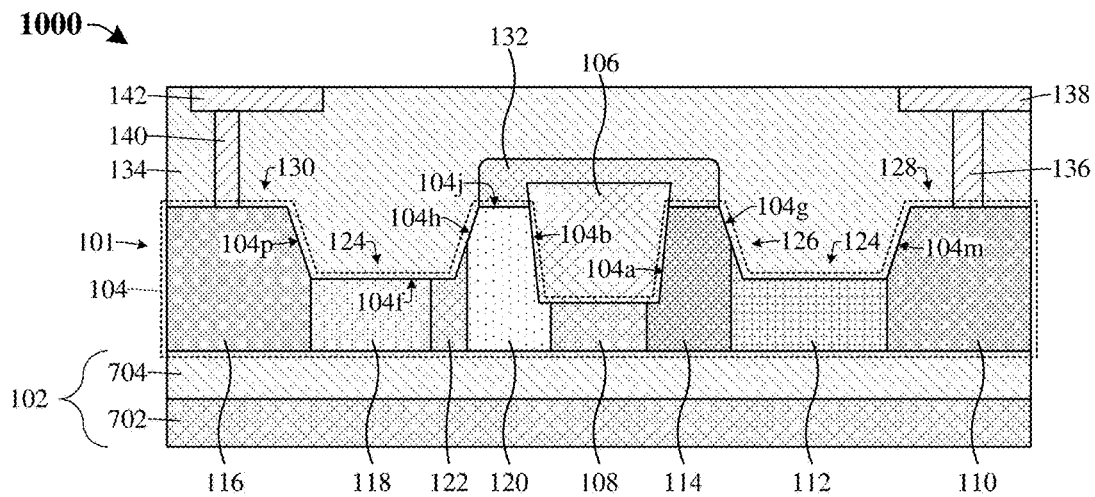
Figure 11:
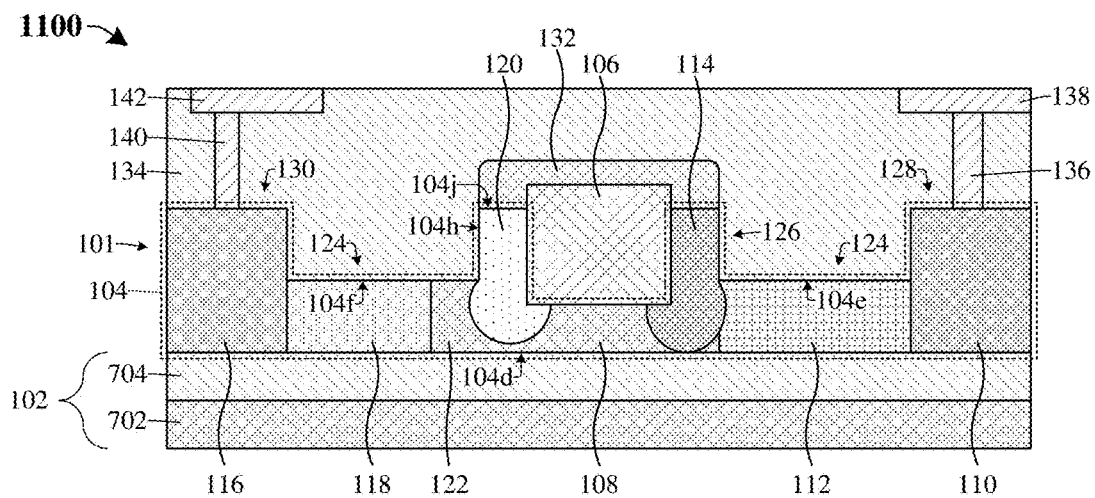
Figure 12:
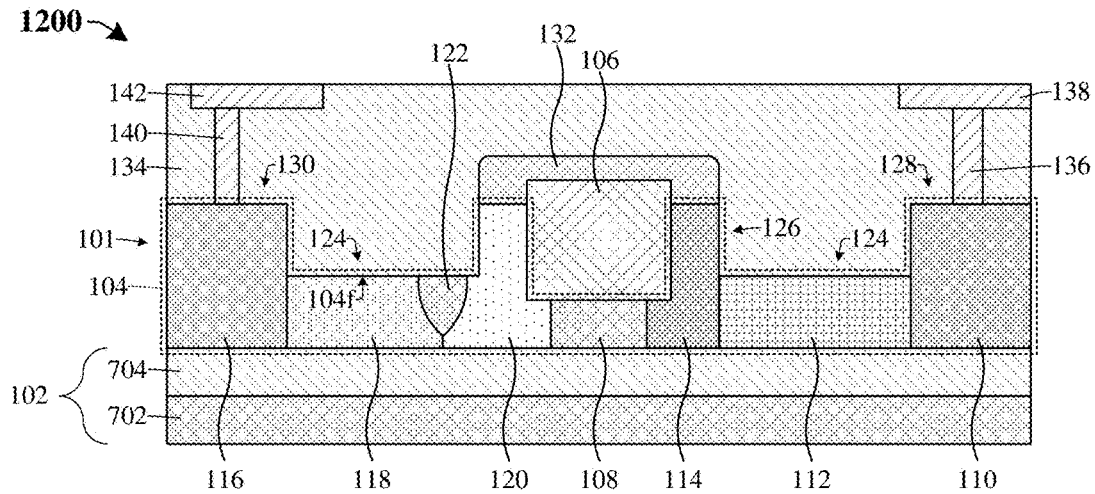
Figure 13:
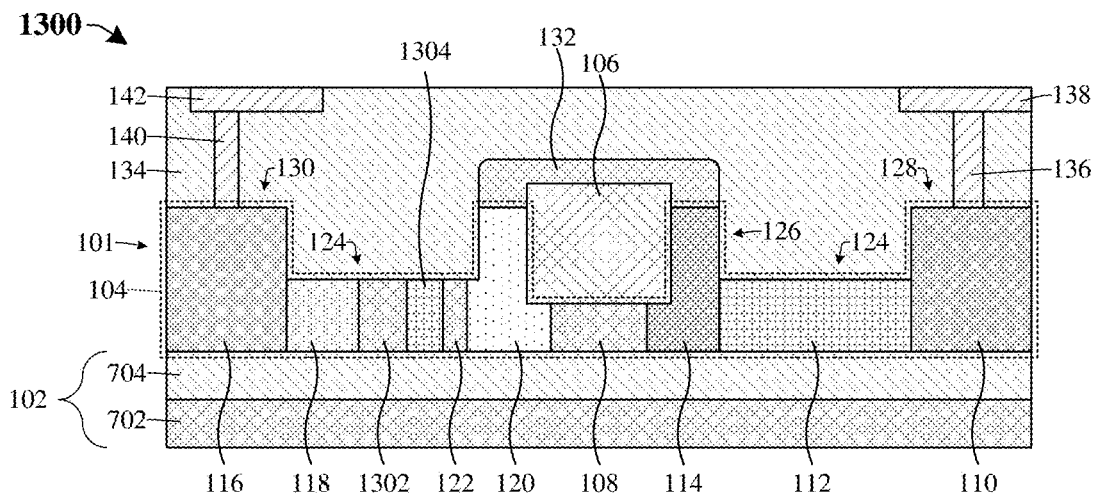
Figure 14:
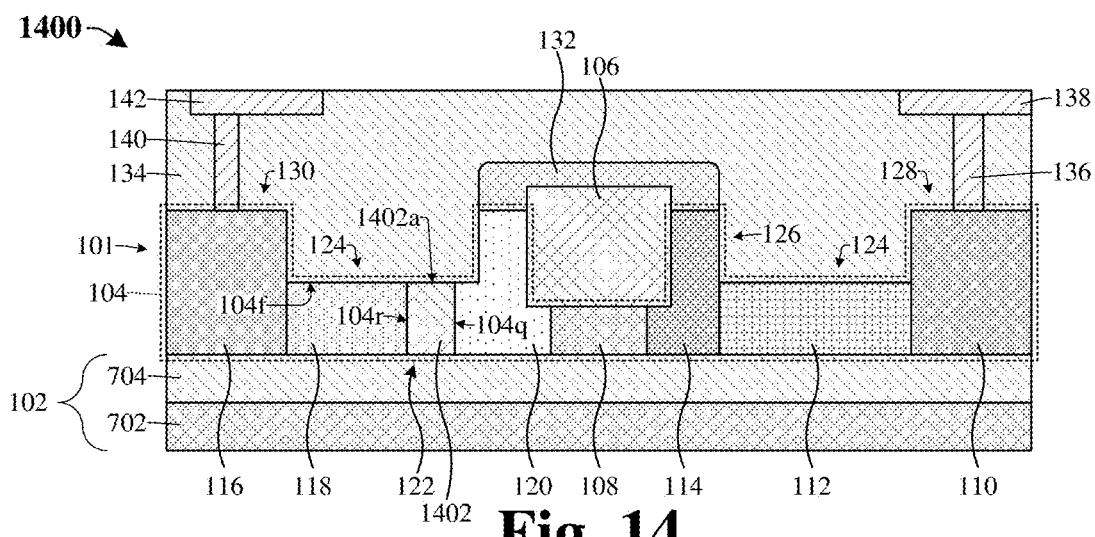
Figure 15:
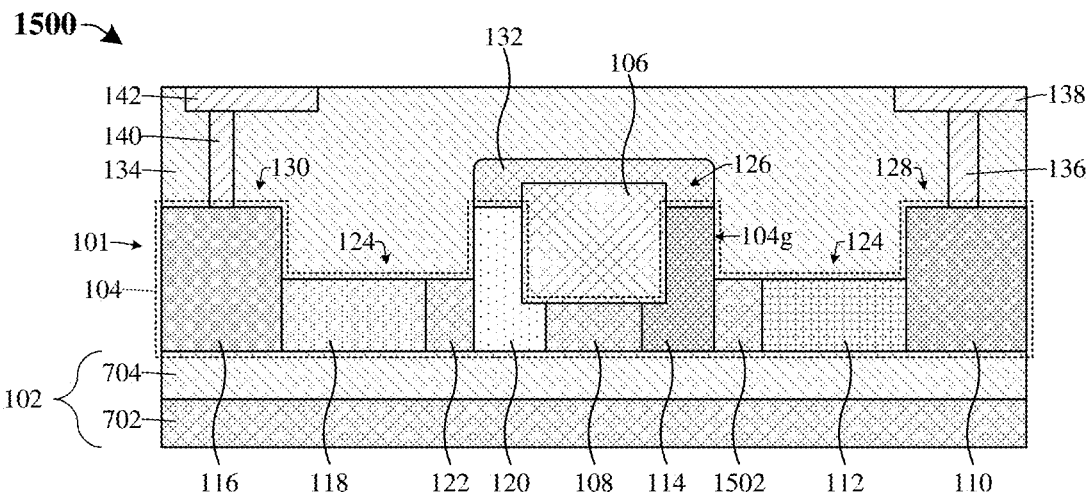
Figure 16:
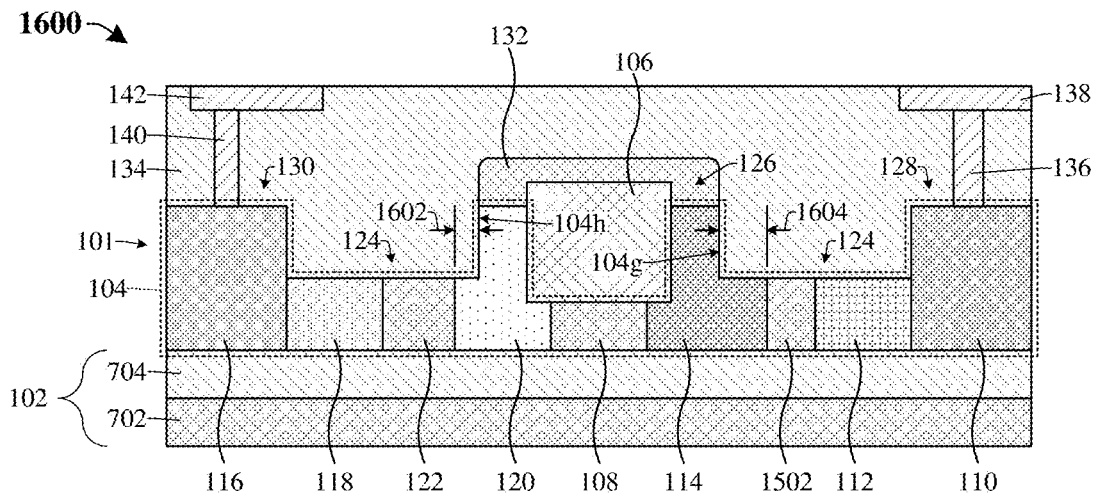
Figure 17:
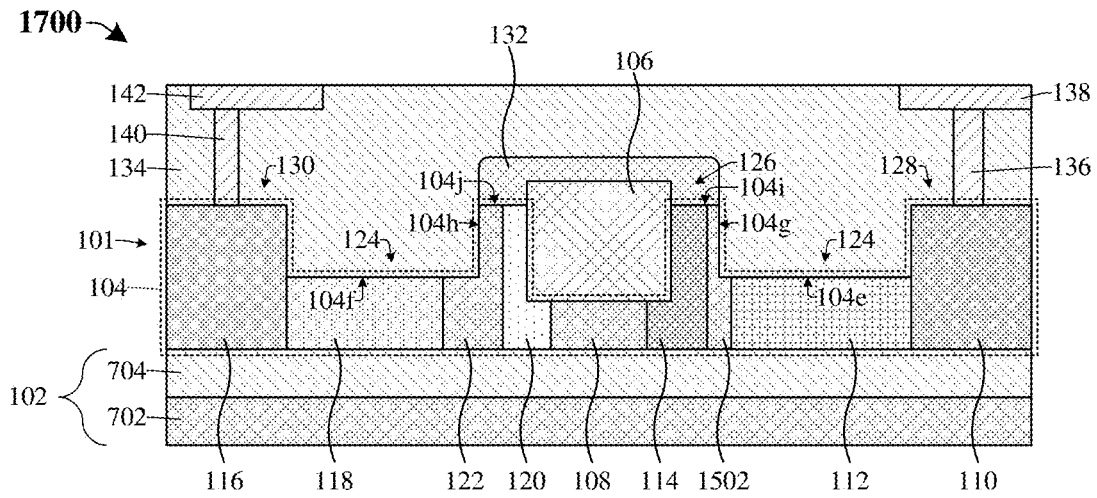
Figure 18:
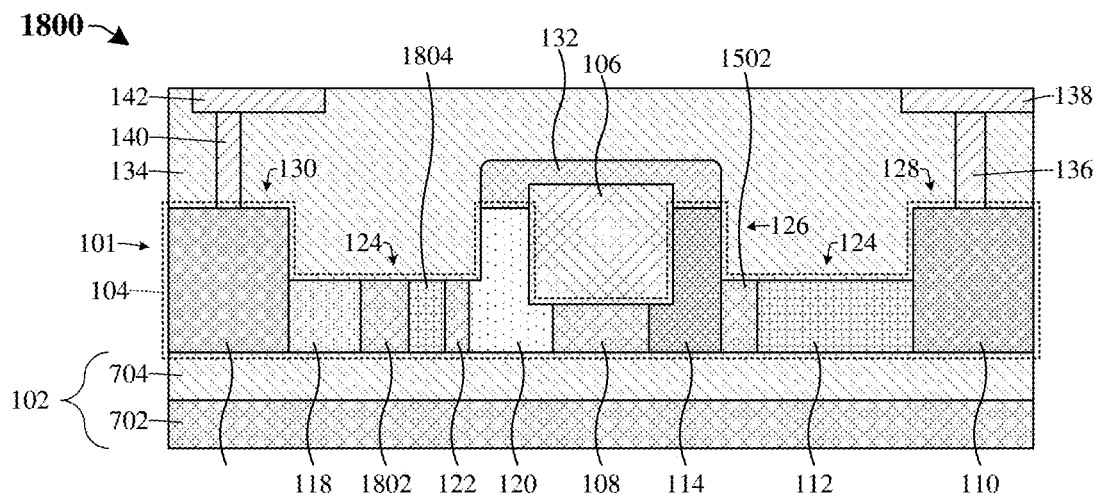

FIGS. 4-6 illustrate top views 400-600 of some embodiments of an integrated chip in which the waveguide photodetector 101 is arranged along various waveguides.

In some embodiments (e.g., as illustrated in top view 400 of FIG. 4), the waveguide photodetector 101 is arranged along a linear waveguide 402. In some embodiments (e.g., as illustrated in top view 500 of FIG. 5), the waveguide photodetector 101 has a dual port configuration in which two waveguides 502, 504 are coupled to the waveguide photodetector 101 on opposite ends of the waveguide photodetector 101. In some embodiments (e.g., as illustrated in top view 600 of FIG. 6), the waveguide photodetector 101 is integrated with a micro-ring resonator/modulator 602.

FIGS. 7-14 illustrate cross-sectional views 700-1400 of various embodiments of the waveguide photodetector 101 of FIG. 1.

In some embodiments (e.g., as illustrated in cross-sectional view 700 of FIG. 7), the second intrinsic region 122 is laterally spaced from the ridge portion 126 of the waveguide photodetector 101 (e.g., spaced from sidewall 104h of the first semiconductor layer 104) by a first non-zero distance 706. For example, the sixth doped region 120 and the second intrinsic region 122 meet at an interface that is laterally spaced from sidewall 104h of the first semiconductor layer 104. In some embodiments, the substrate 102 comprises a base semiconductor layer 702 and an insulator layer 704 (e.g., a buried oxide (BOX) layer) over the base semiconductor layer 702.

In some embodiments, a distance 708 between a first side of the first intrinsic region 108 and the first sidewall 106b of the second semiconductor layer 106 ranges from approximately 0 micrometers to 1 micrometer, 0.25 micrometers to 0.75 micrometers, or some other range. In some embodiments, a distance 710 between a second side of the first intrinsic region 108 and the second sidewall 106c of the second semiconductor layer 106 ranges from approximately 0 micrometers to 1 micrometer, 0.25 micrometers to 0.75 micrometers, or some other range.

In some embodiments (e.g., as illustrated in cross-sectional view 800 of FIG. 8), the second intrinsic region 122 is in the ridge portion 126 of the waveguide photodetector 101. For example, the second intrinsic region 122 extends along a side of the sixth doped region 120 from the bottom surface 104d to the second top surface 104j of the first semiconductor layer 104. Further, the second intrinsic region 122 extends along the fourth sidewall 104h and the second top surface 104j of the first semiconductor layer 104.

In some embodiments (e.g., as illustrated in cross-sectional view 900 of FIG. 9), the second intrinsic region 122 is in both the ridge portion 126 and the slab portion 124. For example, the second intrinsic region 122 extends along the fourth sidewall 104h and the second top surface 104j of the first semiconductor layer 104, and further extends along the third upper surface 104f of the first semiconductor layer 104.

In some embodiments (e.g., as illustrated in cross-sectional view 1000 of FIG. 10), the sidewalls (e.g., 104a, 104b, 104g. 104h, 104m, 104p) of the first semiconductor layer 104 are sloped. Further, the second intrinsic region 122 extends along a lower portion of the fourth sidewall 104h and the sixth doped region 120 extends along an upper portion of the fourth sidewall 104h.

In some embodiments (e.g., as illustrated in cross-sectional view 1100 of FIG. 11), the sixth doped region 120 extends into the first semiconductor layer 104 from the second top surface 104j but does not reach the bottom surface 104d of the first semiconductor layer 104. Thus, the first intrinsic region 108 and the second intrinsic region 122 are connected under the sixth doped region 120 (e.g., forming a common intrinsic region). In some embodiments, the sixth doped region 120 (and the third doped region 114) are balloon shaped in the slab portion 124 of the waveguide photodetector 101 (e. g., below upper surfaces 104c, 104f of the first semiconductor layer 104).

In some embodiments (e.g., as illustrated in cross-sectional view 1200 of FIG. 12), the fifth doped region 118 and the sixth doped region 120 meet at an interface under the second intrinsic region 122. Thus, the second intrinsic region 122 is in the first semiconductor layer 104 along the third upper surface 104*f* of the first semiconductor layer 104 but does not extend to the bottom surface 104*d* of the first semiconductor layer 104.

In some embodiments (e.g., as illustrated in cross-sectional view 1300 of FIG. 13), the first semiconductor layer 104 has a plurality of intrinsic regions laterally spaced from the first intrinsic region 108. For example, in some embodiments, the first semiconductor layer 104 includes a third intrinsic region 1302 laterally between the second intrinsic region 122 and the fifth doped region 118. Further, the first semiconductor layer 104 includes a seventh doped region 1304 laterally between the second intrinsic region 122 and the third intrinsic region 1302. In some embodiments, the seventh doped region has the first doping type (e.g., p-type). In some embodiments, a width of the third intrinsic region 1302 is different than a width of the second intrinsic region 122, and a width of the seventh doped region 1304 is different than a width of the sixth doped region 120.

In some embodiments (e.g., as illustrated in cross-sectional view 1400 of FIG. 14), the second intrinsic region 122 comprises a semiconductor different than that of the first semiconductor layer 104. In some such embodiments, the second intrinsic region 122 is alternatively referred to as a third semiconductor layer 1402 comprising an intrinsic semiconductor different than the semiconductor of the first semiconductor layer 104. The third semiconductor layer 1402 is between a seventh sidewall 104*q* and an eighth sidewall 104*r* of the first semiconductor layer 104. A top surface 1402*a* of the third semiconductor layer 1402 is approximately coplanar with the third upper surface 104*f* of the first semiconductor layer 104.

FIGS. 15-18 illustrate cross-sectional views 1500-1800 of various embodiments of the waveguide photodetector 101 of FIG. 1 in which a third intrinsic region 1502 is between the second doped region 112 and the third doped region 114. By including the third intrinsic region 1502 in the waveguide photodetector 101, charge carrier multiplication may be further increased. Thus, the responsivity of the waveguide photodetector 101 may be further increased.

In some embodiments (e.g., as illustrated in cross-sectional view 1500 of FIG. 15), the third intrinsic region 1502 is adjacent to the ridge portion 126. For example, the third doped region 114 and the third intrinsic region 1502 meet at an interface that is directly under sidewall 104*g* of the first semiconductor layer 104.

In some embodiments (e.g., as illustrated in cross-sectional view 1600 of FIG. 16), the third intrinsic region is laterally spaced from the ridge portion 126. In some embodiments, the second intrinsic region 122 and the third intrinsic region 1502 are spaced from the ridge portion 126 by different distances. For example, the second intrinsic region 122 is laterally spaced from the fourth sidewall 104*h* of the first semiconductor layer 104 by a first distance 1602 and the third intrinsic region is laterally spaced from the third sidewall 104*g* of the first semiconductor layer 104 by a second distance 1604 different than the first distance 1602. Further, in some embodiments, the second intrinsic region 122 and the third intrinsic region 1502 have different widths.

In some embodiments (e.g., as illustrated in cross-sectional view 1700 of FIG. 17), the third intrinsic region 1502 is in both the ridge portion 126 and the slab portion 124. For example, the third intrinsic region 1502 extends along the third sidewall 104*g* and the first top surface 104*i* of the first semiconductor layer 104, and further extends along the second upper surface 104*e* of the first semiconductor layer 104.

In some embodiments (e.g., as illustrated in cross-sectional view 1800 of FIG. 18), the first semiconductor layer 104 includes a different number of intrinsic regions on each side of the ridge portion 126. For example, the first semiconductor layer 104 includes two intrinsic regions (the second intrinsic region 122 and a fourth intrinsic region 1802 with a seventh doped region 1804 therebetween) laterally between the fifth doped region 118 and the sixth doped region 120, and the first semiconductor layer 104 includes one intrinsic region (the third intrinsic region 1502) laterally between the second doped region 112 and the third doped region 114.

FIGS. 19-32 illustrate cross-sectional views 1900-3200 of some embodiments of a method for forming an integrated chip including a waveguide photodetector 101. Although FIGS. 19-32 are described in relation to a method, it will be appreciated that the structures disclosed in FIGS. 19-32 are not limited to such a method, but instead may stand alone as structures independent of the method.

Figure 19:
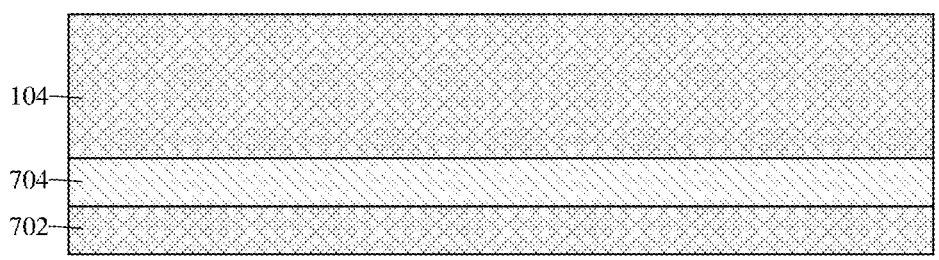
FIGS. 19-32 illustrate cross-sectional views of some embodiments of a method for forming an integrated chip including a waveguide photodetector.

As shown in cross-sectional view 1900 of FIG. 19, an insulator layer 704 is formed over a base semiconductor layer 702 and a first semiconductor layer 104 is formed over the insulator layer 704. In some embodiments, the base semiconductor layer 702 and the first semiconductor layer 104 comprise silicon or some other suitable material. In some embodiments, the insulator layer 704 comprises silicon dioxide or some other suitable material. In some embodiments, the base semiconductor layer 702, the insulator layer 704, and the first semiconductor layer 104 may be provided as an SOI substrate.

Figure 20:
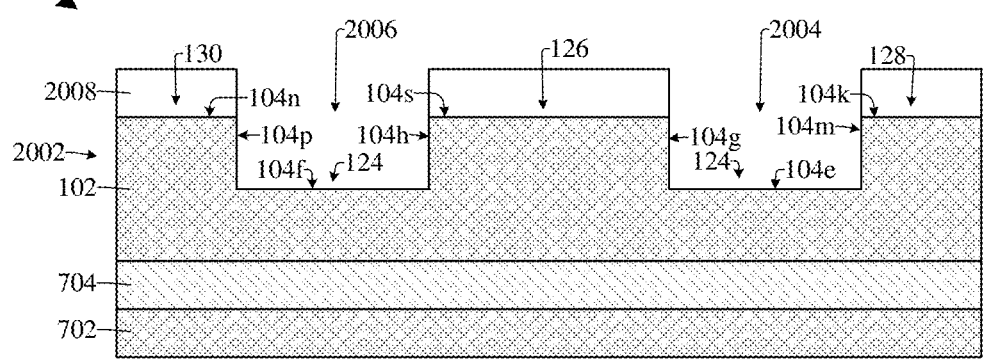

As shown in cross-sectional view 2000 of FIG. 20, the first semiconductor layer 104 is etched to form a waveguide 2002 including a ridge portion 126 and contact portions 128, 130 over a slab portion 124. The etching forms a first recess 2004 in the first semiconductor layer 104 between the ridge portion 126 and the first contact portion 128 and a second recess 2006 in the first semiconductor layer 104 between the ridge portion 126 and the second contact portion 130. The ridge portion 126 is directly between the first recess 2004 and the second recess 2006. The ridge portion 126 is delimited by sidewalls 104*g*. 104*h* and top surface 104*s* of the first semiconductor layer 104. The first contact portion 128 is delimited by sidewall 104*m* and top surface 104*k* of the first semiconductor layer 104. The second contact portion 130 is delimited by sidewall 104*p* and top surface 104*n* of the first semiconductor layer 104. The slab portion 124 is delimited, at least in part, by upper surfaces 104*e*, 104*f* of the first semiconductor layer 104.

In some embodiments, a masking layer 2008 is formed over the first semiconductor layer 104 and the etching is performed according to the masking layer 2008. In some embodiments, the etching comprises a dry etching process such as, for example, a reactive ion etching process, a plasma etching process, an ion beam etching process, or some other suitable process. In some embodiments, the masking layer 2008 is or comprises a photoresist layer, a hard mask layer, or some other suitable layer.

FIGS. 21-25 illustrate cross-sectional views 2100-2500 of some embodiments of a method for forming a first doped region 110, a second doped region 112, a third doped region 114, a fourth doped region 116, a fifth doped region 118, and a sixth doped region 120 in the first semiconductor layer 104 to form a waveguide photodetector 101 along the waveguide 2002.

Figure 21:
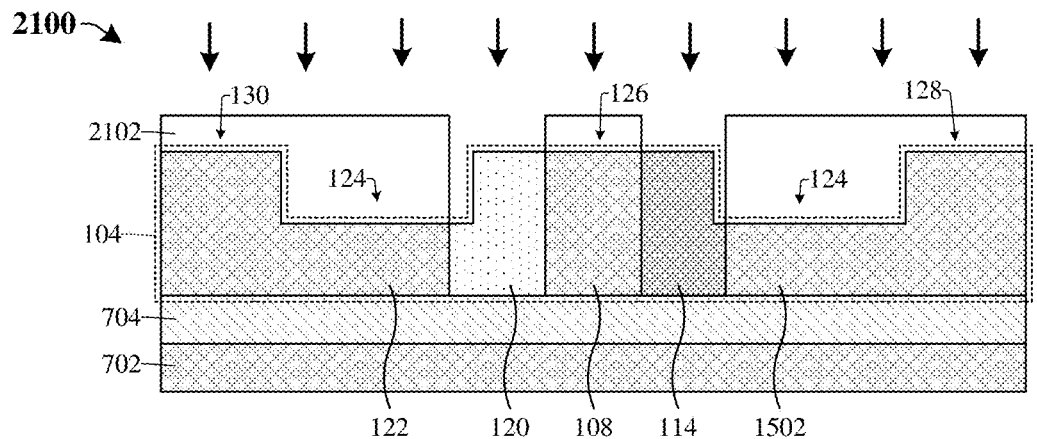

As shown in cross-sectional view 2100 of FIG. 21, the third doped region 114 and the sixth doped region 120 are formed in the first semiconductor layer 104 in the ridge portion 126. The third doped region 114 and the sixth doped region 120 are laterally spaced apart with a first intrinsic region 108 therebetween. A third intrinsic region 1502 is on a first side of the ridge portion 126 and a second intrinsic region 122 is on a second side of the ridge portion 126.

The third doped region 114 and the sixth doped region 120 have a first doping type (e.g., p-type). The doping concentrations of the third doped region 114 and the sixth doped region 120 are approximately equal. In some embodiments, the doping concentrations of the third doped region 114 and the sixth doped region 120 range from $10^{16}$ cm$^{-3}$ to $10^{19}$ cm$^{-3}$, $10^{16}$ cm$^{-3}$ to $10^{18}$ cm$^{-3}$, or some other suitable range.

In some embodiments, the third doped region 114 and the sixth doped region 120 are formed in the first semiconductor layer 104 by an ion implantation process or some other suitable process. In some embodiments, a masking layer 2102 is formed over the first semiconductor layer 104 and the third doped region 114 and the sixth doped region 120 are formed in the first semiconductor layer 104 according to the masking layer 2102. In some embodiments, the masking layer 2102 is or comprises a photoresist layer or some other suitable layer. In some embodiments, the third doped region 114 and the sixth doped region 120 are formed together with a common doping process(es).

Figure 22:
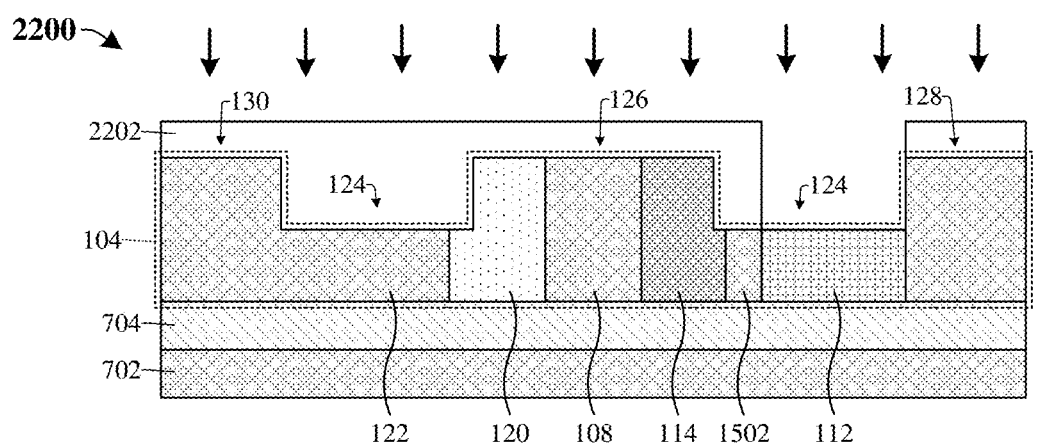

As shown in cross-sectional view 2200 of FIG. 22, the second doped region 112 is formed in the first semiconductor layer 104 in the slab portion 124. In some embodiments, the second doped region 112 is laterally spaced from the third doped region 114 with the third intrinsic region 1502 therebetween. In some other embodiments, the second doped region 112 is formed adjacent to the third doped region 114.

The second doped region 112 has the first doping type. The doping concentration of the second doped region 112 is greater than the doping concentrations of the third doped region 114 and the sixth doped region 120. In some embodiments, the doping concentration of the second doped region 112 ranges from $10^{18}$ cm$^{-3}$ to $10^{20}$ cm$^{-3}$, $10^{19}$ cm$^{-3}$ to $10^{20}$ cm$^{-3}$, or some other suitable range.

In some embodiments, the second doped region 112 is formed in the first semiconductor layer 104 by an ion implantation process or some other suitable process. In some embodiments, a masking layer 2202 is formed over the first semiconductor layer 104 and the second doped region 112 is formed in the first semiconductor layer 104 according to the masking layer 2202. In some embodiments, the masking layer 2202 is or comprises a photoresist layer or some other suitable layer.

Figure 23:
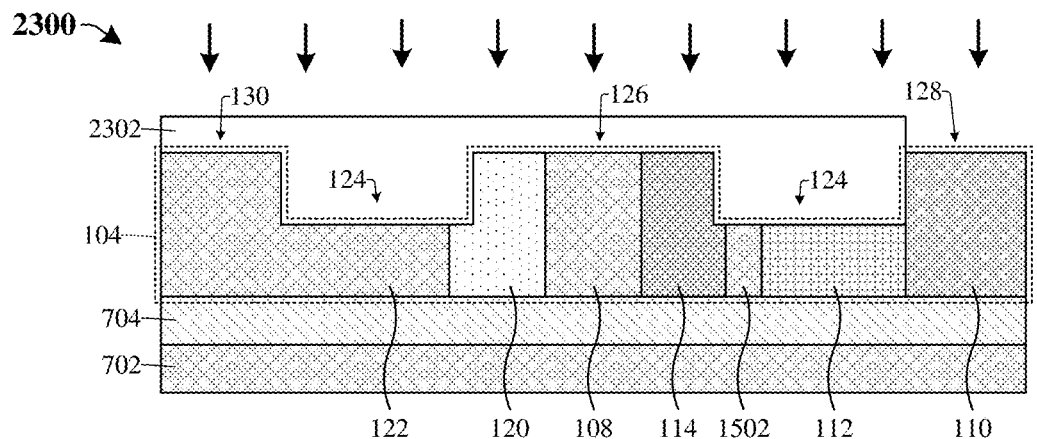

As shown in cross-sectional view 2300 of FIG. 23, the first doped region 110 is formed in the first semiconductor layer 104 in the first contact portion 128. In some embodiments, the first doped region 110 is laterally beside the second doped region 112.

The first doped region 110 has the first doping type. The doping concentration of the first doped region 110 is greater than the doping concentration of the second doped region 112. In some embodiments, the doping concentration of the first doped region 110 ranges from $10^{19}$ cm$^{-3}$ to $10^{22}$ cm$^{-3}$, $10^{20}$ cm$^{-3}$ to $10^{21}$ cm$^{-3}$, or some other suitable range.

In some embodiments, the first doped region 110 is formed in the first semiconductor layer 104 by an ion implantation process or some other suitable process. In some embodiments, a masking layer 2302 is formed over the first semiconductor layer 104 and the first doped region 110 is formed in the first semiconductor layer 104 according to the masking layer 2302. In some embodiments, the masking layer 2302 is or comprises a photoresist layer or some other suitable layer.

Figure 24:
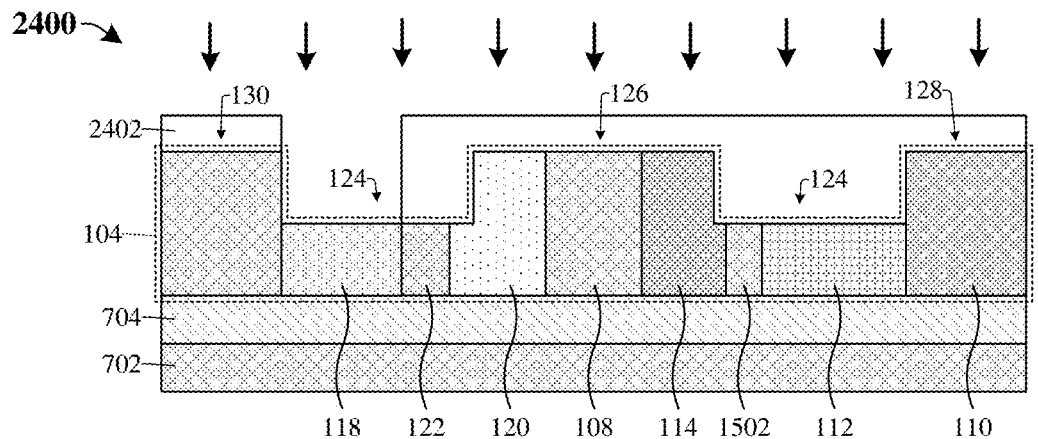

As shown in cross-sectional view 2400 of FIG. 24, the fifth doped region 118 is formed in the first semiconductor layer 104 in the slab portion 124. The fifth doped region 118 is laterally spaced from the sixth doped region 120 with the second intrinsic region 122 therebetween.

The fifth doped region 118 has a second doping type (e.g., n-type) different than the first doping type. The doping concentration of the fifth doped region 118 is greater than the doping concentration of the third doped region 114 and the sixth doped region 120. In some embodiments, the doping concentration of the fifth doped region 118 ranges from $10^{18}$ cm$^{-3}$ to $10^{20}$ cm$^{-3}$, $10^{19}$ cm$^{-3}$ to $10^{20}$ cm$^{-3}$, or some other suitable range.

In some embodiments, the fifth doped region 118 is formed in the first semiconductor layer 104 by an ion implantation process or some other suitable process. In some embodiments, a masking layer 2402 is formed over the first semiconductor layer 104 and the fifth doped region 118 is formed in the first semiconductor layer 104 according to the masking layer 2402. In some embodiments, the masking layer 2402 is or comprises a photoresist layer or some other suitable layer.

Figure 25:
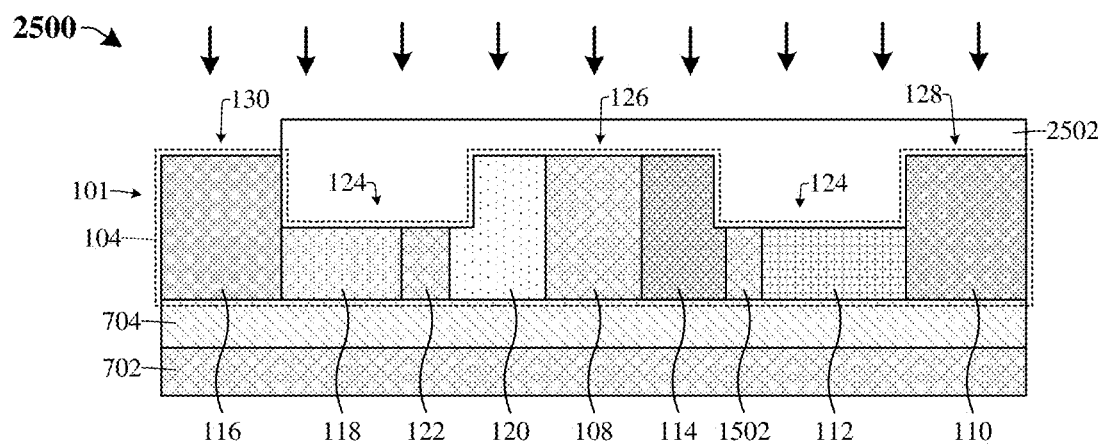

As shown in cross-sectional view 2500 of FIG. 25, the fourth doped region 116 is formed in the first semiconductor layer 104 in the second contact portion 130. In some embodiments, the fourth doped region 116 is laterally beside the fifth doped region 118.

The fourth doped region 116 has the second doping type. The doping concentration of the fourth doped region 116 is greater than the doping concentration of the fifth doped region 118. In some embodiments, the doping concentration of the fourth doped region 116 ranges from $10^{19}$ cm$^{-3}$ to $10^{22}$ cm$^{-3}$, $10^{20}$ cm$^{-3}$ to $10^{21}$ cm$^{-3}$, or some other suitable range.

In some embodiments, the fourth doped region 116 is formed in the first semiconductor layer 104 by an ion implantation process or some other suitable process. In some embodiments, a masking layer 2502 is formed over the first semiconductor layer 104 and the fourth doped region 116 is formed in the first semiconductor layer 104 according to the masking layer 2502. In some embodiments, the masking layer 2502 is or comprises a photoresist layer or some other suitable layer.

Although FIGS. 21-25 illustrate the third doped region 114 and the sixth doped region 120 being formed first followed by the second doped region 112, the first doped region 110, the fifth doped region 118, and the fourth doped region 116, it will be appreciated that in some other embodiments, the doped regions may be formed in a different order. For example, in some embodiments, the third doped region 114 and the sixth doped region may be alternately formed after the first doped region 110, the second doped region 112, the fourth doped region 116, and the fifth doped region 118.

Figure 26:
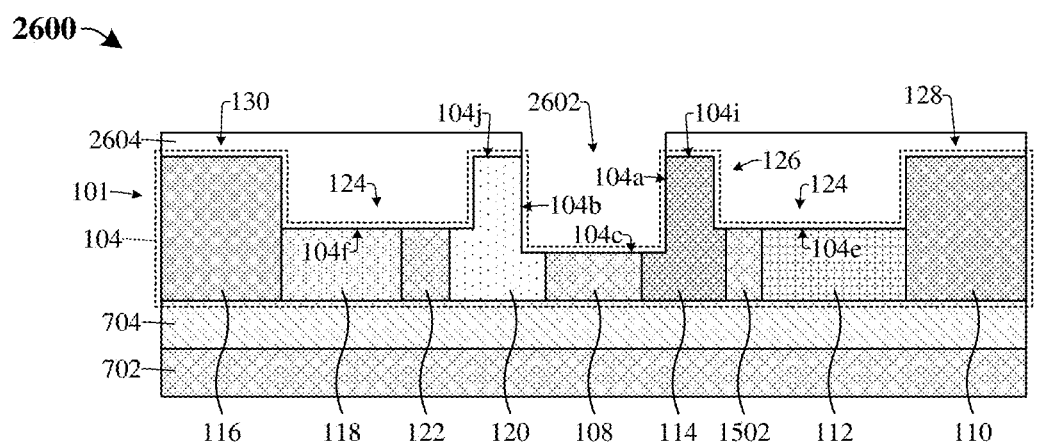

As shown in cross-sectional view 2600 of FIG. 26, the first semiconductor layer 104 is etched to form a third recess 2602 in the ridge portion 126. The etching extends into the third doped region 114, the sixth doped region 120, and the first intrinsic region 108. The third recess 2602 is delimited by sidewalls 104a, 104b and upper surface 104c of the first semiconductor layer 104. The third recess 2602 is directly over the first intrinsic region 108, the third doped region 114, and the sixth doped region 120. The third recess 2602 is directly between the third doped region 114 and the sixth doped region 120. The third recess divides top surface 104s into top surfaces 104i, 104j. In some embodiments, the third recess 2602 extends into the first semiconductor layer 104 to below upper surfaces 104e, 104f of the first semiconductor layer 104 (e.g., upper surface 104c is below upper surfaces 104e, 104f).

In some embodiments, a masking layer 2604 is formed over the first semiconductor layer 104 and the etching is performed according to the masking layer 2604. In some embodiments, the etching comprises a dry etching process such as, for example, a reactive ion etching process, a plasma etching process, an ion beam etching process, or some other suitable process. In some embodiments, the masking layer 2604 is or comprises a photoresist layer, a hard mask layer, or some other suitable layer.

Figure 27:
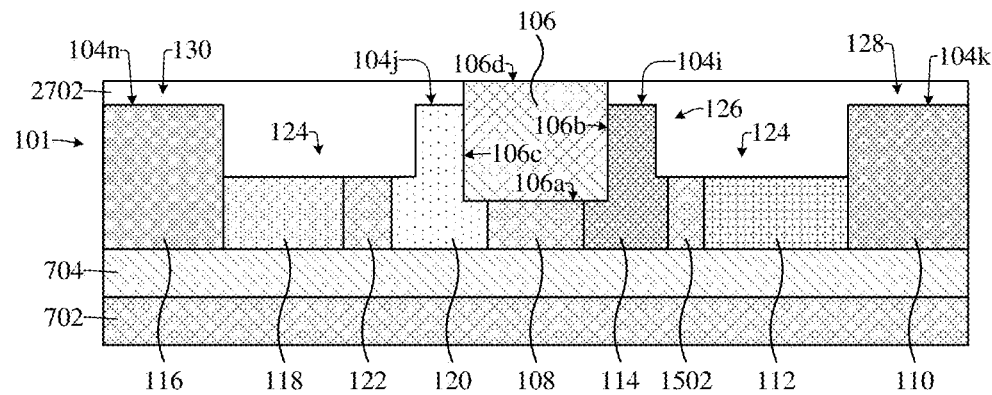

FIG. 27 illustrates cross-sectional view 2700 of some embodiments of a method for forming a second semiconductor layer 106 in the third recess (e.g., 2602 of FIG. 26). As shown in cross-sectional view 2700 of FIG. 27, a blocking layer 2702 is formed over the first semiconductor layer 104 but not in the third recess (e.g., 2602 of FIG. 26) so that the second semiconductor layer 106 can be selectively deposited in the third recess (e.g., 2602 of FIG. 26).

Figure 28:
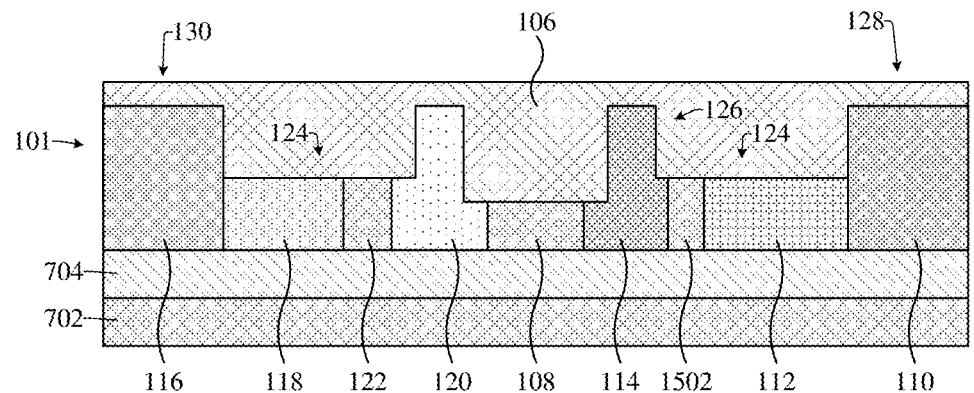
Figure 29:
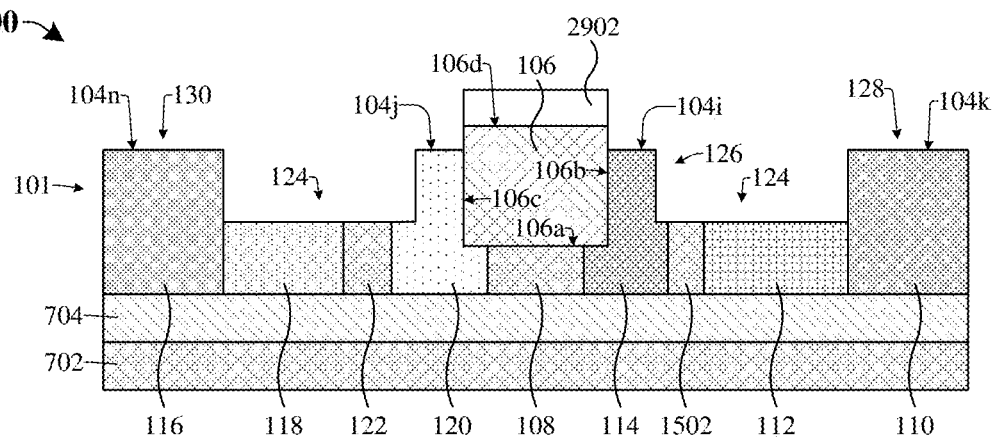

FIGS. 28-29 illustrate cross-sectional views 2800-2900 of some other embodiments of a method for forming a second semiconductor layer 106 in the third recess (e.g., 2602 of FIG. 26). As shown in cross-sectional view 2800 of FIG. 28, a second semiconductor layer 106 is deposited in the third recess (e.g., 2602 of FIG. 26) and over the first semiconductor layer 104. As shown in cross-sectional view 2900 of FIG. 29, the second semiconductor layer 106 is etched according to a masking layer 2902 to remove portions of the second semiconductor layer 106 from over portions of the first semiconductor layer 104 so that the second semiconductor layer 106 remains in the third recess (e.g., 2602 of FIG. 26).

The second semiconductor layer 106 fills the third recess (e.g., 2602 of FIG. 26) and extends above top surfaces 104i, 104j, 104k, 104n of the first semiconductor layer 104. The second semiconductor layer 106 further forms the ridge portion 126 (together with first semiconductor layer 104) of the waveguide photodetector 101. The second semiconductor layer 106 forms an absorption region of the waveguide photodetector 101. The second semiconductor layer 106 comprises a different semiconductor than the first semiconductor layer 104. For example, in some embodiments, the second semiconductor layer 106 comprises germanium or some other suitable material. In some embodiments, the second semiconductor layer 106 is deposited by a chemical vapor deposition (CVD) process, a physical vapor deposition (PVD) process, an atomic layer deposition (ALD) process, or some other suitable process.

Figure 30:
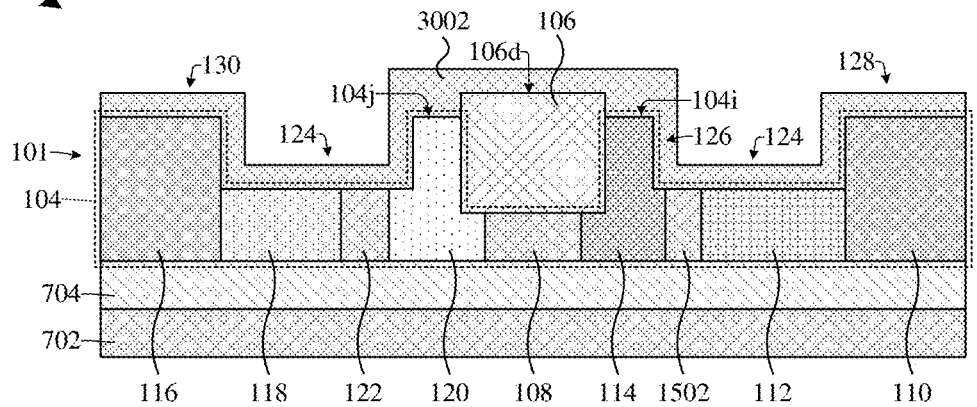

As shown in cross-sectional view 3000 of FIG. 30, a dielectric cap layer 3002 is formed covering the first semiconductor layer 104 and the second semiconductor layer 106. In some embodiments, the dielectric cap layer 3002 comprises silicon nitride or some other suitable material. In some embodiments, the dielectric cap layer 3002 is deposited by a CVD process, a PVD process, an ALD process, or some other suitable process.

Figure 31:
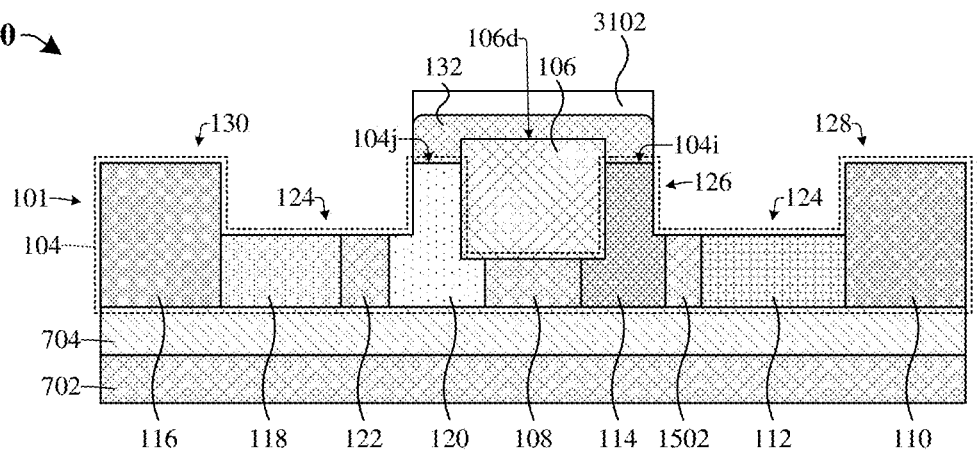

As shown in cross-sectional view 3100 of FIG. 31, the dielectric cap layer (e.g., 3002 of FIG. 30) is etched to form a dielectric cap 132 over the ridge portion 126 from the dielectric cap layer. In some embodiments, a masking layer 3102 is formed over the dielectric cap layer at the ridge portion 126 and the etching is performed according to the masking layer 3102. In some embodiments, the etching comprises a dry etching process such as, for example, a reactive ion etching process, a plasma etching process, an ion beam etching process, or some other suitable process. In some embodiments, the masking layer 3102 is or comprises a photoresist layer, a hard mask layer, or some other suitable layer.

Figure 32:
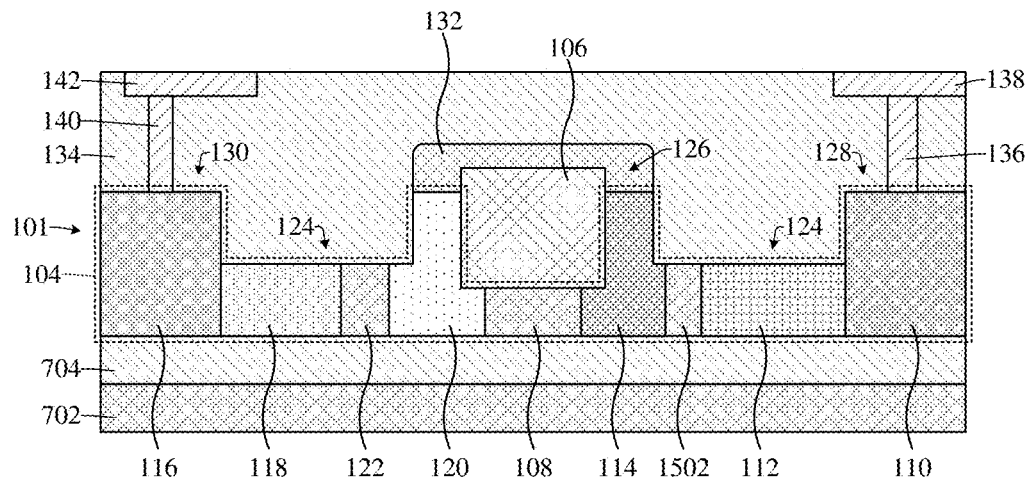

As shown in cross-sectional view 3200 of FIG. 32, a dielectric layer 134 is formed over the waveguide photodetector 101. Further, contacts 136, 140 are formed within the dielectric layer 134 and contacting the first doped region 110 and the fourth doped region 116, respectively. Furthermore, metal lines 138, 142 are formed over the contacts 136, 140, respectively. In some embodiments, the dielectric layer 134 comprises silicon dioxide or some other suitable material. In some embodiments, the dielectric layer 134 is deposited by a CVD process, a PVD process, an ALD process, or some other suitable process. In some embodiments, the contacts 136, 140 and the metal lines 138, 142 are formed within the dielectric layer 134 by etching the dielectric layer 134 and depositing metal over the dielectric layer 134 after the etching.

Figure 33:
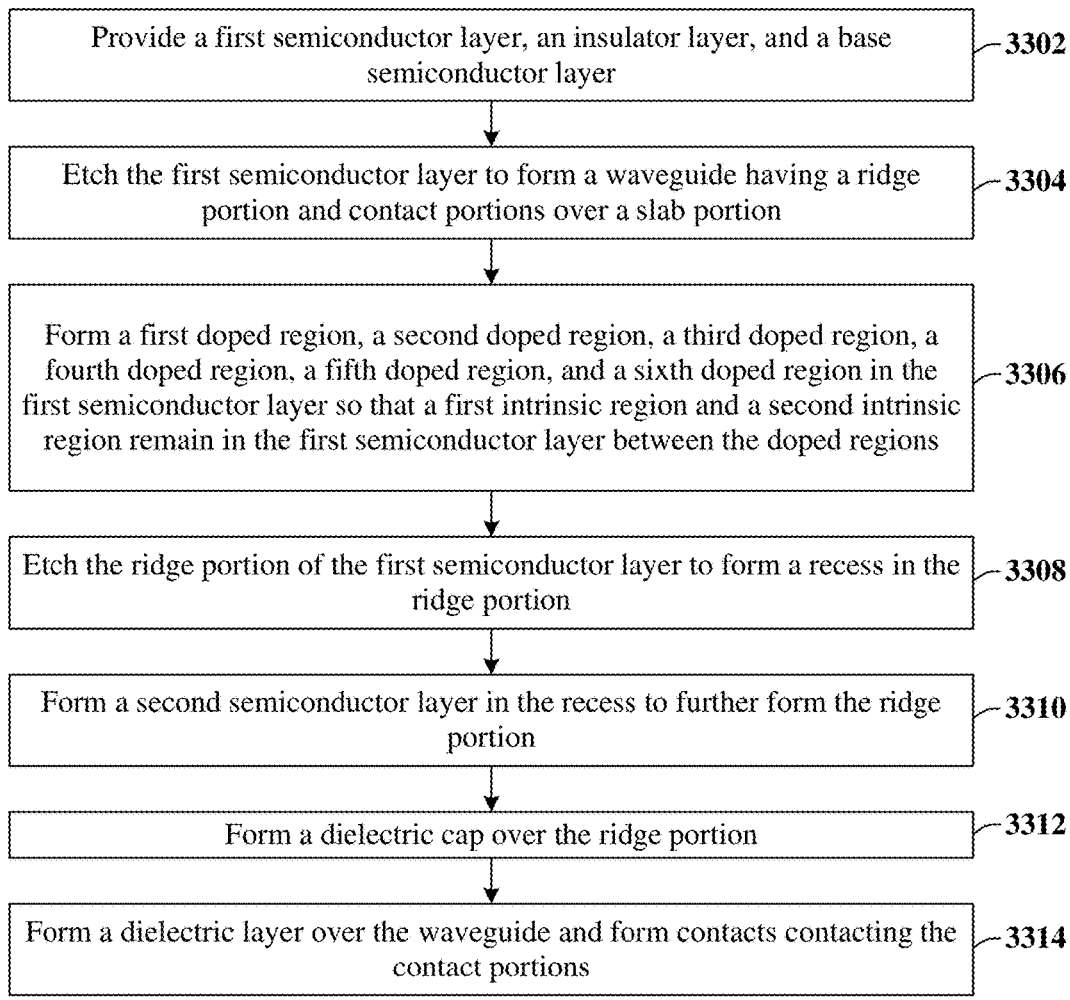
FIG. 33 illustrates a flow diagram of some embodiments of a method for forming an integrated chip including a waveguide photodetector.

FIG. 33 illustrates a flow diagram of some embodiments of a method 3300 for forming an integrated chip including a waveguide photodetector. While method 3300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 3302, provide a first semiconductor layer, an insulator layer, and a base semiconductor layer. The insulator layer is over the base semiconductor layer. The first semiconductor layer is over the insulator layer. FIG. 19 illustrates a cross-sectional view 1900 of some embodiments corresponding to block 3302.

At block 3304, etch the first semiconductor layer to form waveguide having a ridge portion and contact portions over a slab portion. The ridge portion protrudes upward from the slab portion in a center of the waveguide. The contacts portions protrude upward from the slab portion on opposite sides of the ridge portion along outer edges of the waveguide. FIG. 20 illustrates a cross-sectional view 2000 of some embodiments corresponding to block 3304.

At block 3306, form a first doped region, a second doped region, a third doped region, a fourth doped region, a fifth doped region, and a sixth doped region in the first semiconductor layer so that a first intrinsic region and a second intrinsic region remain in the first semiconductor layer between the doped regions. The first doped region and the fourth doped region are formed in the contact portions of the waveguide, respectively. The second doped region and the fifth doped region are formed in the slab portion on opposite sides of the ridge portion. The third doped region and the sixth doped region are formed in the ridge portion with the first intrinsic region therebetween. The second intrinsic region is in the slab portion laterally between the fifth doped region and the sixth doped region. Forming the doped regions in the first semiconductor layer partially forms a waveguide photodetector along the waveguide. The sixth doped region forms a charge region of the waveguide photodetector. The second intrinsic region forms a multiplication region of the waveguide photodetector. FIGS. 21-25 illustrate cross-sectional views 2100-2500 of some embodiments corresponding to block 3306.

At block 3308, etch the ridge portion of the first semiconductor layer to form a recess in the ridge portion. The recess is directly between the third doped region and the sixth doped region and directly over the first intrinsic region. FIG. 26 illustrates a cross-sectional view 2600 of some embodiments corresponding to block 3308.

At block 3310, form a second semiconductor layer in the recess to further form the ridge portion. The second semiconductor layer further forms the waveguide photodetector. For example, the second semiconductor layer forms an absorption region of the waveguide photodetector. FIGS. 27-29 illustrate cross-sectional views 2700-2900 of some embodiments corresponding to block 3310.

At block 3312, form a dielectric cap over the ridge portion. The dielectric cap covers a top surface of the second semiconductor layer and top surfaces of the first semiconductor layer. FIGS. 30-31 illustrate cross-sectional views 3000-3100 of some embodiments corresponding to block 3312.

At block 3314, form a dielectric layer over the waveguide and form contacts contacting the contact portions. FIG. 29 illustrates a cross-sectional view 3200 of some embodiments corresponding to block 3314.

Thus, the present disclosure relates to an integrated chip including a waveguide photodetector, the waveguide photodetector including a charge region and an intrinsic multiplication region to improve the responsivity of the waveguide photodetector.

Accordingly, in some embodiments, the present disclosure relates to an integrated chip including a substrate and a waveguide photodetector over the substrate. The waveguide photodetector includes a slab portion extending laterally over the substrate, a first contact portion protruding upward from the slab portion, a second contact portion protruding upward from the slab portion and laterally spaced from the first contact portion, and a ridge portion protruding upward from the slab portion between the first contact portion and the second contact portion. A first semiconductor layer including a first semiconductor is over the substrate. The first semiconductor layer has a first sidewall, a second sidewall, a first top surface, a second top surface partially delimiting the ridge portion of the waveguide photodetector. The first semiconductor layer includes a first doped region having a first doping type in the first contact portion, a second doped region having the first doping type in the slab portion laterally between the first contact portion and the ridge portion, a third doped region having the first doping type in the ridge portion, a fourth doped region having a second doping type, different than the first doping type, in the second contact portion, a fifth doped region having the second doping type in the slab portion laterally between the second contact portion and the ridge portion, a sixth doped region in the ridge portion, and a first intrinsic region laterally between the sixth doped region and the third doped region. A second semiconductor layer is over the first intrinsic region and laterally between the sixth doped region and the third doped region. The second semiconductor layer includes a second semiconductor different than the first semiconductor. The second semiconductor layer has a first sidewall, a second sidewall, and a top surface further delimiting the ridge portion of the waveguide photodetector. The sixth doped region has the first doping type. The first semiconductor layer further includes a second intrinsic region laterally between the sixth doped region and the fifth doped region.

In other embodiments, the present disclosure relates to an integrated chip including a substrate, a first semiconductor layer over the substrate, and a second semiconductor layer over the substrate. The first semiconductor layer includes a first semiconductor. The second semiconductor layer includes a second semiconductor different than the first semiconductor. The first semiconductor layer is between the second semiconductor layer and the substrate. The first semiconductor layer includes a first intrinsic region, a first doped region, a second doped region, a third doped region, a fourth doped region, a fifth doped region, a sixth doped region, and a second intrinsic region. The first intrinsic region is directly under the second semiconductor layer. The first doped region is laterally spaced from the first intrinsic region and the second semiconductor layer in a first direction. The first doped region has a first doping type and a first doping concentration. The second doped region is laterally between the first doped region and the first intrinsic region. The second doped region has the first doping type and a second doping concentration less than the first doping concentration. The third doped region is laterally between the second doped region and the first intrinsic region. The third doped region is beside the first intrinsic region, directly under the second semiconductor layer, and extends upward along a first sidewall of the second semiconductor layer. The third doped region has the first doping type and a third doping concentration less than the second doping concentration. The fourth doped region is laterally spaced from the first intrinsic region and the second semiconductor layer in a second direction opposite the first direction. The fourth doped region has a second doping type, different than the first doping type, and a fourth doping concentration. The fifth doped region is laterally between the fourth doped region and the first intrinsic region. The fifth doped region has the second doping type and a fifth doping concentration less than the fourth doping concentration. The sixth doped region is laterally between the fifth doped region and the first intrinsic region. The sixth doped region is beside the first intrinsic region, directly under the second semiconductor layer, and extends upward along a second sidewall of the second semiconductor layer. The sixth doped region has the first doping type and a sixth doping concentration less than the second doping concentration. The second intrinsic region is laterally between the sixth doped region and the fifth doped region.

In yet other embodiments, the present disclosure relates to a method for forming an integrated chip. A first semiconductor layer is formed over a substrate. The first semiconductor layer includes a first semiconductor. The first semiconductor layer is etched to form a waveguide including a ridge portion, a first contact portion, and a second contact portion laterally spaced over a slab portion. The ridge portion is delimited by a first sidewall, a second sidewall, and a top surface of the first semiconductor layer. A first doped region is formed in the first semiconductor layer and laterally spaced from the ridge portion in a first direction. The first doped region has a first doping type and a first doping concentration. A second doped region is formed in the first semiconductor layer laterally between the ridge portion the first doped region. The second doped region has the first doping type and a second doping concentration less than the first doping concentration. A third doped region and a sixth doped region are formed in first semiconductor layer at the ridge portion. A first intrinsic region of the first semiconductor layer is between the third doped region and the sixth doped region. The third doped region and the sixth doped region has the first doping type and a third doping concentration less than the second doping concentration. A fourth doped region is formed in the first semiconductor layer and laterally spaced from the ridge portion in a second direction opposite the first direction. The fourth doped region has a second doping type, different than the first doping type, and a fourth doping concentration. A fifth doped region is formed in the first semiconductor layer and laterally between the fourth doped region and the ridge portion. The fifth doped region has the second doping type and a fifth doping concentration less than the fourth doping concentration. A second intrinsic region of the first semiconductor layer is between the fifth doped region and the sixth doped region. The ridge portion is etched between the third doped region and the sixth doped region to form a third recess in the ridge portion. The third recess is delimited by a third sidewall, a fourth sidewall, and an upper surface of the first semiconductor layer. The third doped region extends along the third sidewall and the upper surface of the first semiconductor layer. The sixth doped region extends along the fourth sidewall and the upper surface of the first semiconductor layer. The first intrinsic region extends along the upper surface of the first semiconductor layer. A second semiconductor layer is formed in the third recess, over the upper surface of the first semiconductor layer, and between the third sidewall and the fourth sidewall of the first semiconductor layer. The second semiconductor layer includes a second semiconductor different than the first semiconductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a substrate;
   a waveguide photodetector over the substrate, the waveguide photodetector including a slab portion extending laterally over the substrate, a first contact portion protruding upward from the slab portion, a second contact portion protruding upward from the slab portion and laterally spaced from the first contact portion, and a ridge portion protruding upward from the slab portion between the first contact portion and the second contact portion;
   a first semiconductor layer comprising a first semiconductor over the substrate, the first semiconductor layer having a first sidewall, a second sidewall, a first top surface, and a second top surface partially delimiting the ridge portion of the waveguide photodetector, the first semiconductor layer including a first doped region having a first doping type in the first contact portion, a second doped region having the first doping type in the slab portion laterally between the first contact portion and the ridge portion, a third doped region having the first doping type in the ridge portion, a fourth doped region having a second doping type, different than the first doping type, in the second contact portion, a fifth doped region having the second doping type in the slab portion laterally between the second contact portion and the ridge portion, a sixth doped region in the ridge portion, and a first intrinsic region laterally between the sixth doped region and the third doped region; and
   a second semiconductor layer over the first intrinsic region and laterally between the sixth doped region and the third doped region, the second semiconductor layer comprising a second semiconductor different than the first semiconductor, the second semiconductor layer having a first sidewall, a second sidewall, and a top surface further delimiting the ridge portion of the waveguide photodetector,
   wherein the sixth doped region has the first doping type, and wherein the first semiconductor layer further includes a second intrinsic region laterally between the sixth doped region and the fifth doped region.

2. The integrated chip of claim 1, wherein the first semiconductor layer further includes a third intrinsic region laterally between the second doped region and the third doped region.

3. The integrated chip of claim 1, wherein the sixth doped region and the second intrinsic region meet at an interface that is directly under the second sidewall of the first semiconductor layer.

4. The integrated chip of claim 1, wherein the sixth doped region and the second intrinsic region meet at an interface that is laterally spaced from the second sidewall of the first semiconductor layer towards the second contact portion.

5. The integrated chip of claim 1, wherein the first semiconductor layer has an upper surface partially delimiting the slab portion of the waveguide photodetector, wherein the second intrinsic region is in the ridge portion and the slab portion, and wherein the second intrinsic region extends along the second sidewall and the upper surface of the first semiconductor layer.

6. The integrated chip of claim 1, further comprising:
   a dielectric cap covering the first top surface of the first semiconductor layer, the second top surface of the first semiconductor layer, an upper portion of the first sidewall of the second semiconductor layer, an upper portion of the second sidewall of the second semiconductor layer, and the top surface of the second semiconductor layer.

7. The integrated chip of claim 1, wherein the first semiconductor layer has a bottom surface, a first upper surface, and a second upper surface partially delimiting the slab portion of the waveguide photodetector, wherein the top surface of the second semiconductor layer is above the first top surface and the second top surface of the first semiconductor layer, and wherein a bottom surface of the second semiconductor layer is below the first upper surface and the second upper surface of the first semiconductor layer.

8. An integrated chip comprising:
   a substrate;
   a first semiconductor layer and a second semiconductor layer over the substrate, the first semiconductor layer comprising a first semiconductor, the second semiconductor layer comprising a second semiconductor different than the first semiconductor, the first semiconductor layer between the second semiconductor layer and the substrate, the first semiconductor layer comprising:
      a first intrinsic region directly under the second semiconductor layer;

a first doped region laterally spaced from the first intrinsic region and the second semiconductor layer in a first direction, the first doped region having a first doping type and a first doping concentration;

a second doped region laterally between the first doped region and the first intrinsic region, the second doped region having the first doping type and a second doping concentration less than the first doping concentration;

a third doped region laterally between the second doped region and the first intrinsic region, the third doped region beside the first intrinsic region, directly under the second semiconductor layer, and extending upward along a first sidewall of the second semiconductor layer, the third doped region having the first doping type and a third doping concentration less than the second doping concentration;

a fourth doped region laterally spaced from the first intrinsic region and the second semiconductor layer in a second direction opposite the first direction, the fourth doped region having a second doping type, different than the first doping type, and a fourth doping concentration;

a fifth doped region laterally between the fourth doped region and the first intrinsic region, the fifth doped region having the second doping type and a fifth doping concentration less than the fourth doping concentration;

a sixth doped region laterally between the fifth doped region and the first intrinsic region, the sixth doped region beside the first intrinsic region, directly under the second semiconductor layer, and extending upward along a second sidewall of the second semiconductor layer, the sixth doped region having the first doping type and a sixth doping concentration less than the second doping concentration; and a second intrinsic region laterally between the sixth doped region and the fifth doped region.

9. The integrated chip of claim 8, the first semiconductor layer further comprising:
a third intrinsic region laterally between the second doped region and the third doped region.

10. The integrated chip of claim 8, the first semiconductor layer further comprising:
a third intrinsic region laterally between the second intrinsic region and the fifth doped region; and
a seventh doped region laterally between the second intrinsic region and the third intrinsic region.

11. The integrated chip of claim 10, the first semiconductor layer further comprising:
a fourth intrinsic region laterally between the second doped region and the third doped region.

12. The integrated chip of claim 8, wherein the first intrinsic region and the second intrinsic region connect under the sixth doped region.

13. The integrated chip of claim 8, wherein the fifth doped region and the sixth doped region meet at an interface that is directly under the second intrinsic region.

14. The integrated chip of claim 1, wherein the second intrinsic region comprises a third semiconductor different than the first semiconductor.

15. A method for forming an integrated chip, the method comprising:
forming a first semiconductor layer over a substrate, the first semiconductor layer comprising a first semiconductor;

etching the first semiconductor layer to form a waveguide including a ridge portion, a first contact portion, and a second contact portion laterally spaced over a slab portion, the ridge portion delimited by a first sidewall, a second sidewall, and a top surface of the first semiconductor layer;

forming a first doped region in the first semiconductor layer and laterally spaced from the ridge portion in a first direction, the first doped region having a first doping type and a first doping concentration;

forming a second doped region in the first semiconductor layer laterally between the ridge portion and the first doped region, the second doped region having the first doping type and a second doping concentration less than the first doping concentration;

forming a third doped region and a sixth doped region in the first semiconductor layer at the ridge portion, wherein a first intrinsic region of the first semiconductor layer is between the third doped region and the sixth doped region, the third doped region and the sixth doped region having the first doping type and a third doping concentration less than the second doping concentration;

forming a fourth doped region in the first semiconductor layer and laterally spaced from the ridge portion in a second direction opposite the first direction, the fourth doped region having a second doping type, different than the first doping type, and a fourth doping concentration;

forming a fifth doped region in the first semiconductor layer and laterally between the fourth doped region and the ridge portion, the fifth doped region having the second doping type and a fifth doping concentration less than the fourth doping concentration, wherein a second intrinsic region of the first semiconductor layer is between the fifth doped region and the sixth doped region;

etching the ridge portion between the third doped region and the sixth doped region to form a third recess in the ridge portion, wherein the third recess is delimited by a third sidewall, a fourth sidewall, and an upper surface of the first semiconductor layer, wherein the third doped region extends along the third sidewall and the upper surface of the first semiconductor layer, the sixth doped region extends along the fourth sidewall and the upper surface of the first semiconductor layer, and the first intrinsic region extends along the upper surface of the first semiconductor layer; and forming a second semiconductor layer in the third recess, over the upper surface of the first semiconductor layer, and between the third sidewall and the fourth sidewall of the first semiconductor layer, the second semiconductor layer comprising a second semiconductor different than the first semiconductor.

16. The method of claim 15, wherein a third intrinsic region of the first semiconductor layer is between the second doped region and the third doped region.

17. The method of claim 15, wherein forming the second semiconductor layer in the third recess comprises forming a blocking layer over the first semiconductor layer on opposite sides of the third recess and depositing the second semiconductor layer in the third recess with the blocking layer in place.

18. The method of claim 15, wherein forming the second semiconductor layer in the third recess comprises depositing the second semiconductor layer over the first semiconductor layer and in the third recess, and etching the second semiconductor layer to remove the second semiconductor layer from over the first semiconductor layer on opposite sides of the third recess.

19. The method of claim 15, wherein the etching of the ridge portion extends into the top surface of the first semiconductor layer and removes a portion of the third doped region, a portion of the sixth doped region, and a portion of the first intrinsic region.

20. The method of claim 15, wherein the third doped region and the sixth doped region are formed with a common doping process.

* * * * *